US012588242B2

(12) United States Patent (10) Patent No.: US 12,588,242 B2
Chiu et al. (45) Date of Patent: Mar. 24, 2026

(54) FIELD EFFECT TRANSISTOR WITH DUAL SILICIDE AND METHOD

(71) Applicant: Taiwan Semiconductor Manufacturing Co., Ltd., Hsinchu (TW)

(72) Inventors: Shih-Chuan Chiu, Hsinchu (TW); Lo-Heng Chang, Hsinchu (TW); Huan-Chieh Su, Hsinchu (TW); Cheng-Chi Chuang, Hsinchu (TW); Yun Ju Fan, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 721 days.

(21) Appl. No.: 17/720,276

(22) Filed: Apr. 13, 2022

(65) Prior Publication Data

US 2022/0406909 A1 Dec. 22, 2022

Related U.S. Application Data

(60) Provisional application No. 63/211,695, filed on Jun. 17, 2021.

(51) Int. Cl.
*H01L 21/265* (2006.01)
*H01L 21/266* (2006.01)
(Continued)

(52) U.S. Cl.
CPC ... *H10D 30/6729* (2025.01); *H01L 21/26513* (2013.01); *H01L 21/266* (2013.01);
(Continued)

(58) Field of Classification Search
CPC ........... H01L 29/41733; H01L 29/0665; H01L 29/42392; H01L 29/45; H01L 29/66545;
(Continued)

(56) References Cited

U.S. PATENT DOCUMENTS 4,910,578 A * 3/1990 Okamoto .......... H01L 23/53223
257/757
6,025,620 A * 2/2000 Kimura ................ H10B 12/033
257/306
(Continued)

FOREIGN PATENT DOCUMENTS

TW 202141802 A 11/2021
TW 202209575 A 3/2022
TW 202211472 A 3/2022

*Primary Examiner* — William B Partridge
*Assistant Examiner* — Linda J. Fleck
(74) *Attorney, Agent, or Firm* — Seed Intellectual Property Law Group LLP

(57) ABSTRACT

A device includes a substrate, a gate structure, a source/drain region, a first silicide layer, a second silicide layer and a contact. The gate structure wraps around at least one vertical stack of nanostructure channels. The source/drain region abuts the gate structure. The first silicide layer includes a first metal component on the source/drain region. The second silicide layer includes a second metal component different than the first metal component, and is on the first silicide layer. The contact is on the second silicide layer.

20 Claims, 26 Drawing Sheets

(51) Int. Cl.

| | |
|---|---|
| *H01L 21/285* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 64/62* | (2025.01) |

(52) U.S. Cl.
CPC ..... *H01L 21/28518* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 64/018* (2025.01); *H10D 64/62* (2025.01)

(58) Field of Classification Search
CPC ......... H01L 29/66553; H01L 29/66742; H01L 29/78618; H01L 29/78696; H01L 29/1079; H01L 29/0673; H01L 29/0847; H01L 29/41725; H01L 29/66439; H01L 29/665; H01L 29/165; H01L 29/7848; H01L 29/775; H01L 29/41791; H01L 29/6656; H01L 29/66795; H01L 29/785; H01L 21/26513; H01L 21/266; H01L 21/28518; H01L 21/76831; H01L 21/76832; H01L 21/76858; H01L 21/76897; B82Y 10/00; H10D 30/6729; H10D 30/031; H10D 30/6713; H10D 30/6735; H10D 30/6757; H10D 30/797; H10D 30/43; H10D 30/014; H10D 30/0212; H10D 30/024; H10D 30/62; H10D 30/6219; H10D 64/017; H10D 64/018; H10D 64/62; H10D 64/251; H10D 64/021; H10D 62/118; H10D 62/364; H10D 62/822; H10D 62/121; H10D 62/151
See application file for complete search history.

(56) References Cited

U.S. PATENT DOCUMENTS

| | | | | |
|---|---|---|---|---|
| 7,132,683 | B1 * | 11/2006 | Krishnan | H01L 21/84 |
| | | | | 257/40 |
| 9,236,267 | B2 | 1/2016 | De et al. | |
| 9,502,265 | B1 | 11/2016 | Jiang et al. | |
| 9,520,466 | B2 | 12/2016 | Holland et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,786,774 | B2 | 10/2017 | Colinge et al. | |
| 9,837,357 | B1 | 12/2017 | Adusumilli et al. | |
| 9,853,101 | B2 | 12/2017 | Peng et al. | |
| 9,881,993 | B2 | 1/2018 | Ching et al. | |
| 2005/0045965 | A1 * | 3/2005 | Lin | H10D 30/6737 |
| | | | | 257/E29.147 |
| 2008/0237603 | A1 * | 10/2008 | Lodha | H10D 84/038 |
| | | | | 29/842 |
| 2013/0062669 | A1 | 3/2013 | Chen et al. | |
| 2015/0091093 | A1 * | 4/2015 | Bouche | H01L 29/45 |
| | | | | 257/369 |
| 2015/0243663 | A1 * | 8/2015 | Hung | H10D 84/0172 |
| | | | | 257/365 |
| 2015/0255353 | A1 * | 9/2015 | Wan | H01L 21/823814 |
| | | | | 257/369 |
| 2018/0090582 | A1 * | 3/2018 | Adusumilli | H01L 27/0924 |
| 2019/0103265 | A1 * | 4/2019 | Kao | H01L 27/0886 |
| 2020/0294864 | A1 * | 9/2020 | Chu | H01L 21/28556 |
| 2020/0294998 | A1 * | 9/2020 | Lilak | H01L 23/535 |
| 2021/0336033 | A1 * | 10/2021 | Huang | H10D 84/0177 |

* cited by examiner

1000

1100 — Form isolated fin lattice structures

1200 — Form sacrificial gate structures

1300 — Form spacer layer abutting sacrificial gate structures and inner spacers between nanosheets 1400 — Form second and third spacer layers over P-type and N-type source/drain regions 1500 — Replace sacrificial gate structures with active gate structures 1600 — Expose P-type source/drain region and protect N-type source/drain region

2100 Form first silicide region in P-type source/drain region

2200 Expose N-type source/drain region

2300 Form first spacer layer in openings over N-type and P-type source/drain regions 2400 Form second silicide regions in N-type and P-type source/drain regions 2500 Form source/drain contacts in the openings

FIELD EFFECT TRANSISTOR WITH DUAL SILICIDE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16, 17 is a flowchart illustrating a method of fabricating a semiconductor device according to various aspects of the present disclosure.

DETAILED DESCRIPTION

Figure 1A:
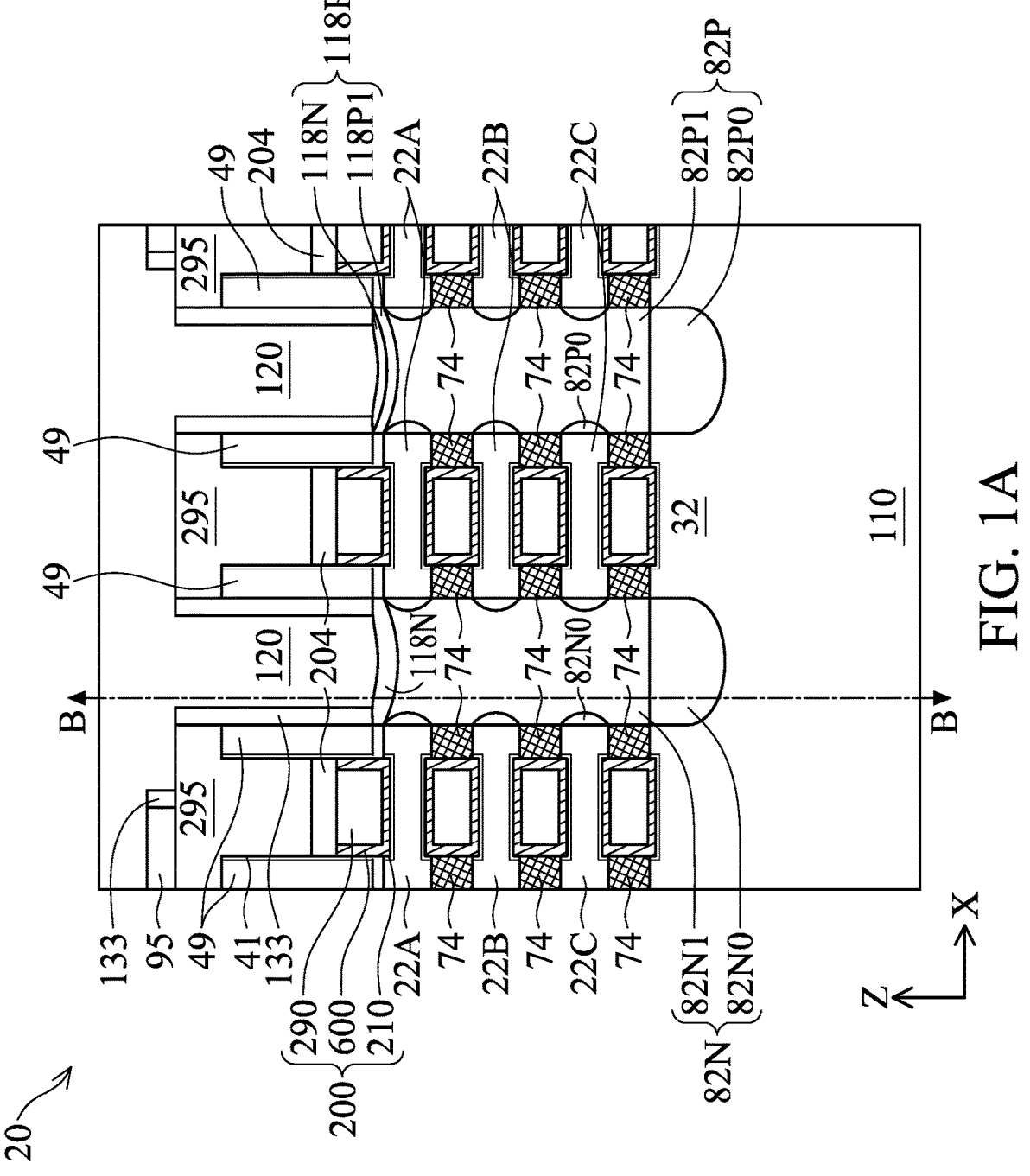
FIGS. 1A, 1B are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-type FETs (FinFETs), or nanostructure devices (e.g. gate-all-around FETs (GAA FETs), nanosheet transistors, nanowire transistors, multi bridge channel FETs, nano ribbon transistors). In advanced technology nodes, electronic device performance may be sensitive to contact resistance between source/drain epitaxial structures and source/drain contacts (or "plugs"). Many devices employ a single work function silicide at each of N-type and P-type epitaxial sites. If silicide work function is near the conduction band of silicon, N-type metal-oxide-semiconductor (NMOS) transistors can achieve better contact resistance. However, P-type metal-oxide-semiconductor (PMOS) transistors exhibit excessively high silicide/epitaxy interface resistance. P-type epitaxial structures may also need high activation. As such, P-type dopant implant may be performed, which incurs higher cost due to an added photolithography operation.

Embodiments of the disclosure use a front-end-of-line (FEOL) dielectric hard mask (HM; or, "spacer layers") on N-type epitaxial structures during P+ implant and P work function silicide processes. Use of a self-aligned P+ implant may prevent P+ implantation into NMOS regions. A self-aligned dual silicide process combined with high P-type epitaxial activation is achieved without additional photolithography cost. Use of dual silicide combined with self-aligned P+ implantation for better contact resistance improves speed performance and lowers cost.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure.

Figure 1B:
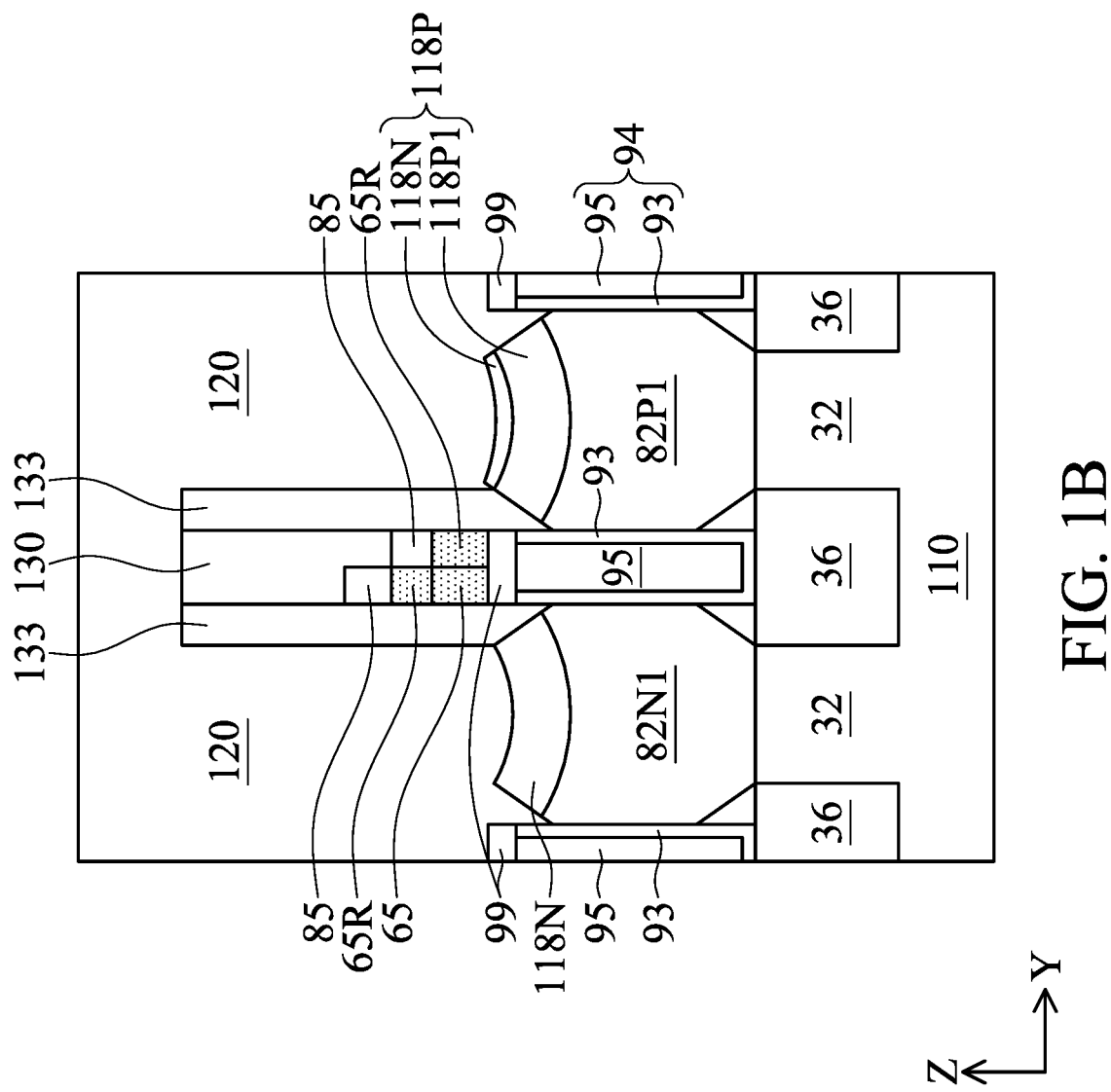

FIGS. 1A, 1B illustrate diagrammatic cross-sectional side views of a portion of a nanostructure device 20. FIG. 1A is a diagrammatic side view of a portion of the nanostructure device 20 in accordance with various embodiments. FIG. 1B is a diagrammatic side view of a portion of the nanostructure device 20 along cross-sectional line B-B of FIG. 1A, in accordance with various other embodiments.

Referring to FIG. 1A and FIG. 1B, the nanostructure device 20 may be or include one or more N-type FETs (NFETs) or P-type FETs (PFETs). The nanostructure device 20 is formed over and/or in a substrate 110, and generally includes gate structures 200 straddling and/or wrapping around semiconductor channels 22A-22C, alternately referred to as "nanostructures," located over semiconductor fins 32 protruding from, and separated by, isolation structures 36 (see FIG. 1B). The gate structure 200 controls current flow through the channels 22A-22C.

The nanostructure device 20 is shown including three channels 22A-22C, which are laterally abutted by source/drain features 82P, 82N (collectively referred to as "source/drain features 82"), and covered and surrounded by the gate structure 200. Generally, the number of channels 22 is two or more, such as three (FIGS. 1A, 1B) or four or more. The gate structure 200 controls flow of electrical current through the channels 22A-22C to and from the source/drain features 82 based on voltages applied at the gate structure 200 and at the source/drain features 82.

In some embodiments, the fin structure 32 includes silicon. In some embodiments, the nanostructure device 20 includes an NFET, and the source/drain features 82 thereof include silicon phosphorous (SiP), SiAs, SiSb, SiPAs, SiP:As:Sb, combinations thereof, or the like. In some embodiments, the nanostructure device 20 includes a PFET, and the source/drain features 82 thereof include silicon germanium (SiGe), either undoped or doped to form, for example, SiGe:B, SiGe:B:Ga, SiGe:Sn, SiGe:B:Sn, or another appropriate semiconductor material. Generally, the source/drain features 82 may include any combination of appropriate semiconductor material(s) and appropriate dopant(s).

The channels 22A-22C each include a semiconductive material, for example silicon or a silicon compound, such as silicon germanium, or the like. The channels 22A-22C are nanostructures (e.g., having sizes that are in a range of a few nanometers) and may also each have an elongated shape and extend in the X-direction. In some embodiments, the channels 22A-22C each have a nanowire (NW) shape, a nanosheet (NS) shape, a nanotube (NT) shape, or other suitable nanoscale shape. The cross-sectional profile of the channels 22A-22C may be rectangular, round, square, circular, elliptical, hexagonal, or combinations thereof.

Figure 3B:
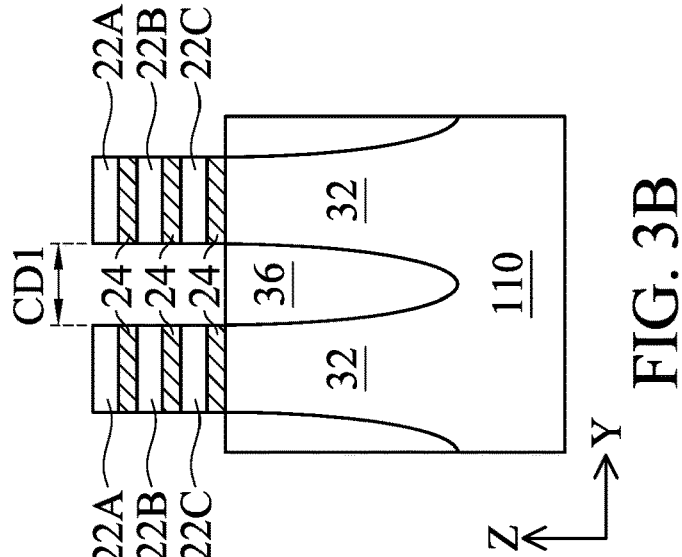
Figure 3A:
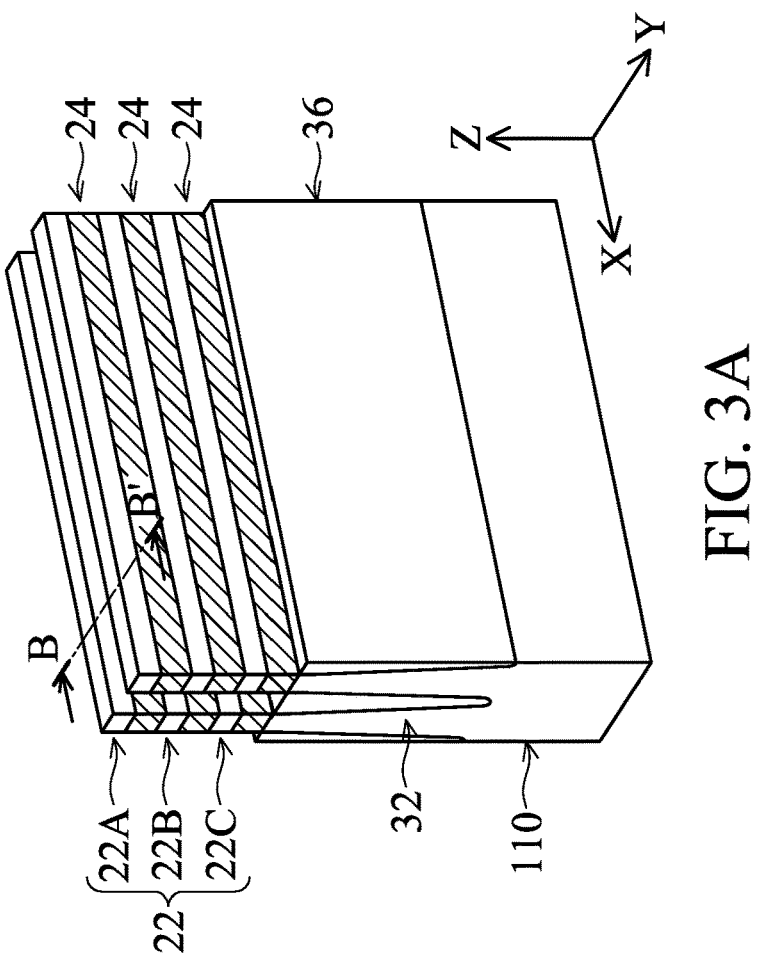

In some embodiments, the lengths (e.g., measured in the X-direction) of the channels 22A-22C may be different from each other, for example due to tapering during a fin etching process (see FIGS. 3A, 3B). In some embodiments, length of the channel 22A may be less than a length of the channel 22B, which may be less than a length of the channel 22C. The channels 22A-22C each may not have uniform thickness (e.g., along the X-axis direction), for example due to a channel trimming process used to expand spacing (e.g., measured in the Z-axis direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape, and is illustrated in FIG. 1A.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction, not shown in FIG. 1C, orthogonal to the X-Z plane) of each of the channels 22A-22C is at least about 8 nm.

The gate structure 200 is disposed over and between the channels 22A-22C, respectively. In some embodiments, the gate structure 200 is disposed over and between the channels 22A-22C, which are silicon channels for N-type devices or silicon germanium channels for P-type devices. In some embodiments, the gate structure 200 includes an interfacial layer (IL) 210, one or more gate dielectric layers 600, one or more work function tuning layers 900 (see FIG. 15), and a metal fill layer 290.

The interfacial layer 210, which may be an oxide of the material of the channels 22A-22C, is formed on exposed areas of the channels 22A-22C and the top surface of the fin 32. The interfacial layer 210 promotes adhesion of the gate dielectric layers 600 to the channels 22A-22C. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the nanostructure device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as Co, W, Ru, combinations thereof, or the like. In some embodiments, the metal fill layer 290 is or includes a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. Between the channels 22A-22C, the metal fill layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal fill layer 290 to increase adhesion. The glue layer is not specifically illustrated in FIGS. 1A, 1B for simplicity.

Overlying the gate dielectric layer 600 and the gate fill layer 290 are a first capping layer 204 and a second capping layer 295. The first capping layer 204 protects the gate structure 200. In some embodiments, the first capping layer 204 is or includes a dielectric material, such as $SiO_2$, SiN, SiCN, SiOCN, a high-k dielectric material (e.g., $Al_2O_3$), or the like. In some embodiments, the first capping layer 204 has thickness (e.g., in the Z-axis direction) in a range of about 1 nm to about 5 nm. The first capping layer 204 may prevent current leakage following one or more etching operations, which may be performed to form gate contacts, source/drain contacts 120, isolation structures (e.g., source/ drain contact isolation structures), or the like. In some embodiments, the first capping layer 204 is or comprises a dielectric material that is harder than, for example, the second capping layer 295, such as aluminum oxide, or other suitable dielectric material.

The second capping layer 295, also referred to as a "self-aligned capping" (SAC) layer, may provide protection to the underlying gate structure 200, and may also act as a CMP stop layer when planarizing the source/drain contacts 120 following formation thereof. The second capping layer 295 may be a dielectric layer including a dielectric material, such as $SiO_2$, SiN, SiCN, SiC, SiOC, SiOCN, $HfO_2$, $ZrO_2$, $ZrAlO_x$, $HfAlO_x$, $HfSiO_x$, $Al_2O_3$, BN, or other suitable dielectric material. In some embodiments, over longer gate structures and channels, the second capping layer 295 may be split by a support structure. In some embodiments, width (X direction) of the second capping layer 295 is in a range of about 8 nm to about 40 nm.

The nanostructure device 20 also includes gate spacers 41 that are disposed on sidewalls of the gate dielectric layer 600 and the IL 210 above the channel 22A, and inner spacers 74 that are disposed on sidewalls of the IL 210 between the channels 22A-22C. The inner spacers 74 are also disposed between the channels 22A-22C. The gate spacers 41 and the inner spacers 74 may include a dielectric material, for example a low-k material such as SiOCN, SiON, SiN, or SiOC. In some embodiments, one or more additional spacer layers 49 are present abutting the gate spacers 41, as shown in FIG. 1A.

The nanostructure device 20 may further include source/drain contacts 120 (shown in FIGS. 1A, 1B; collectively referred to as "source drain contacts 120") that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. In some embodiments, height of the source/drain contacts 120 may be in a range of about 1 nm to about 50 nm. In some embodiments, a spacer layer 133 is present between the source/drain contacts 120 and a second capping layer 295, the spacer layer(s) 41/49 and the gate structures 200. In some embodiments, the spacer layer 133 is or includes one or more of SiN, SiCN, SiOCN, a high-k dielectric, $SiO_2$, or the like. The spacer layer 133 may have thickness in a range of about 2 nm to about 6 nm. The spacer layer 133 is configured to prevent electrical shorts between the gate structure 200 and the source/drain contacts 120.

Silicide layers 118P, 118N (or collectively, "silicide layers 118") are formed between the source/drain features 82 and the source/drain contacts 120, at least to reduce the source/drain contact resistance. The silicide layer 118N may also be referred to as an "N-type work function silicide." The silicide layer 118N includes a portion in contact with the source/drain feature 82N and a portion in contact with the silicide layer 118P over the source/drain feature 82P. In some embodiments, the silicide layer 118N is or includes TiSi, CrSi, TaSi, MoSi, ZrSi, HfSi, ScSi, YSi, HoSi, TbSi, GdSi, LuSi, DySi, ErSi, YbSi, or the like. The silicide layer 118N may have thickness in a range of about 1 nm to about 10 nm. Thickness lower than about 1 nm may lead to an insufficient reduction in contact resistance. Thickness above about 10 nm may cause electrical shorting with the nanostructures 22.

In some embodiments, the silicide layer 118N is present below, and in contact with, the spacer layer 133, as shown in FIG. 1A.

The silicide layer 118P may also be referred to as a "P-type work function silicide." In some embodiments, the silicide layer 118P includes a first silicide layer 118P1 and the silicide layer 118N. The first silicide layer 118P1 may be in contact with the source/drain feature 82P. In some embodiments, the first silicide layer 118P1 is or includes NiSi, CoSi, MnSi, WSi, FeSi, RhSi, PdSi, RuSi, PtSi, IrSi, OsSi, or the like. The first silicide layer 118P1 may have thickness in a range of about 1 nm to about 10 nm. Thickness lower than about 1 nm may lead to an insufficient reduction in contact resistance. Thickness above about 10 nm may cause electrical shorting with the nanostructures 22. In some embodiments, the first silicide layer 118P1 is present below, and in contact with, the spacer layer 133, as shown in FIG. 1A.

In some embodiments, P+ dopants may be present in a P+ doped region 103R (see FIG. 11C) of the source/drain feature 82P underlying the first silicide layer 118P1, which is described in greater detail with reference to FIG. 11C. The P+ dopants may be implanted prior to formation of the first silicide layer 118P1, and may include, for example, Ga, B, C, Sn, or the like. Use of P+ implants may reduce the contact resistance. Concentration of the P+ dopants in the region of the source/drain feature 82P may be in a range of about $1 \times 10^{18}$ cm$^{-3}$ to about $1 \times 10^{21}$ cm$^{-3}$. Over about $1 \times 10^{21}$ cm$^{-3}$, the second P-type epitaxial region 82P1 of the source/drain region 82P may be damaged. Depth of implantation of the P+ dopants may be in a range of about 3 nm to about 10 nm. A region in which the P+ dopants are implanted may not react completely with metal used to form the silicide layer. As such, the P+ doped region 103R may remain under the first silicide layer 118P1.

The silicide layer 118N overlying the source/drain feature 82P may have the same or similar material composition as the silicide layer 118N overlying the source/drain feature 82N, and may have different thickness than the silicide layer 118N overlying the source/drain feature 82N. In some embodiments, the first silicide layer 118P1 is thicker than the portion of the silicide layer 118N overlying the source/drain feature 82P. In some embodiments, ratio of thickness of the first silicide layer 118P1 to thickness of the silicide layer 118N over the source/drain feature 82P is in a range of about 3 to about 5. The first silicide layer 118P1 being thicker than the silicide layer 118N may reduce contact resistance between the source/drain contact 120 and the source/drain feature 82P. In some embodiments, thickness of the silicide layer 118N overlying the source/drain feature 82N is substantially the same as that of the first silicide layer 118P1 overlying the source/drain feature 82P.

In some embodiments, the nanostructure device 20 further includes an interlayer dielectric (ILD) 130 (see FIG. 1B). The ILD 130 provides electrical isolation between the various components of the nanostructure device 20 discussed above, for example between the gate structure 200 and the source/drain contact 120 therebetween. An etch stop layer (not shown) may be formed prior to forming the ILD 130, and may be positioned laterally between the ILD 130 and the gate spacers 41 and vertically between the ILD 130 and the source/drain features 82. In some embodiments, the etch stop layer is or includes SiN, SiCN, SiC, SiOC, SiOCN, HfO$_2$, ZrO$_2$, ZrAlO$_x$, HfAlO$_x$, HfSiO$_x$, Al$_2$O$_3$, or other suitable material. In some embodiments, thickness of the etch stop layer is in a range of about 1 nm to about 5 nm. In some embodiments, where the ILD 130 is not present (e.g., is removed completely prior to formation of the source/drain contact 120), the etch stop layer may be in contact with the source/drain contact 120. The etch stop layer may be trimmed, for example, in the X-axis direction prior to formation of the source/drain contact 120 to improve fill quality of the source/drain contact 120.

Figure 17:
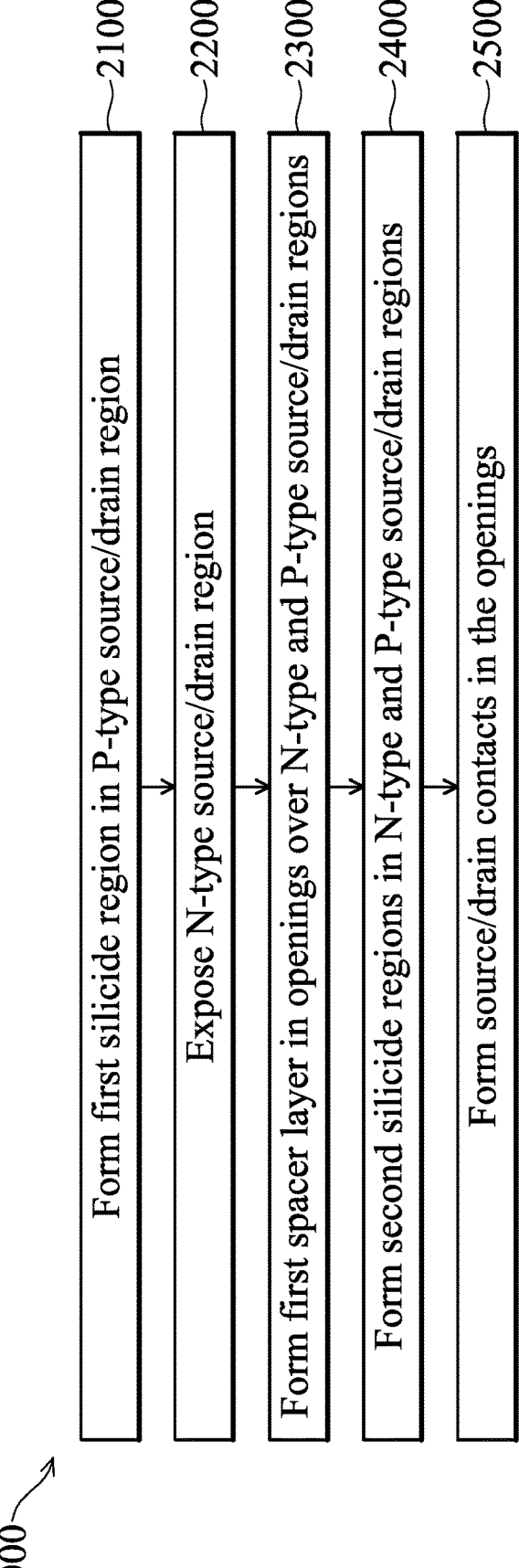

FIGS. 16, 17 illustrate flowcharts of methods 1000, 2000 for forming an IC device or a portion thereof from a workpiece, according to one or more aspects of the present disclosure. Methods 1000, 2000 are merely examples and are not intended to limit the present disclosure to what is explicitly illustrated in methods 1000, 2000. Additional acts can be provided before, during and after the methods 1000, 2000 and some acts described can be replaced, eliminated, or moved around for additional embodiments of the methods. Not all acts are described herein in detail for reasons of simplicity. Methods 1000, 2000 are described below in conjunction with fragmentary perspective and/or cross-sectional views of a workpiece, shown in FIGS. 2A-15, at different stages of fabrication according to embodiments of methods 1000, 2000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 15 are perspective views and cross-sectional views of intermediate stages in the manufacturing of FETs, such as nanosheet FETs, in accordance with some embodiments. FIGS. 2A, 3A, 4A, 5A and 6A illustrate perspective views. FIGS. 2B, 3B, 4B, 5B, 6B, 7B, 8B, 9B, 10B, 11B, 11C, 12B, 13B and 14B illustrate side views taken along reference cross-section B-B' (gate cut) shown in FIGS. 2A, 3A, 4A, 5A and 6A. FIGS. 4C, 5C, 6C, 6D, 7A, 8A, 9A, 9C, 9D, 10A, 11A, 12A, 13A and 14A illustrate side views taken along reference cross-section C-C' (channel/fin cut) illustrated in FIG. 4A. FIG. 14C illustrates an alternative embodiment in the X-Z plane.

Figure 2B:
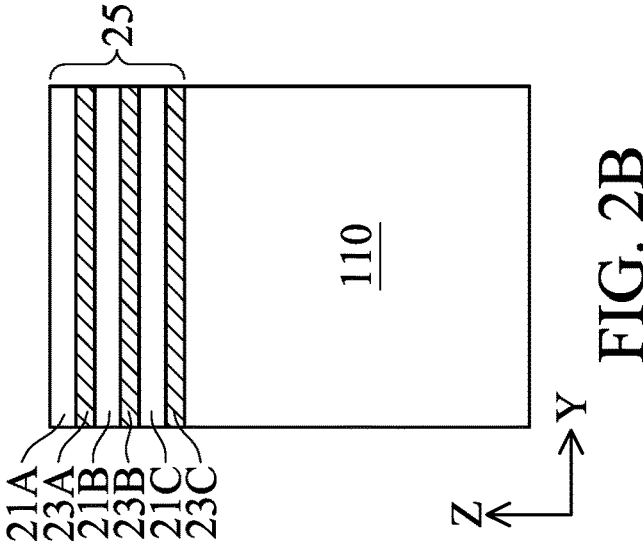
FIGS. 2A-15 are views of various embodiments of an IC device of at various stages of fabrication according to various aspects of the present disclosure.
Figure 2A:
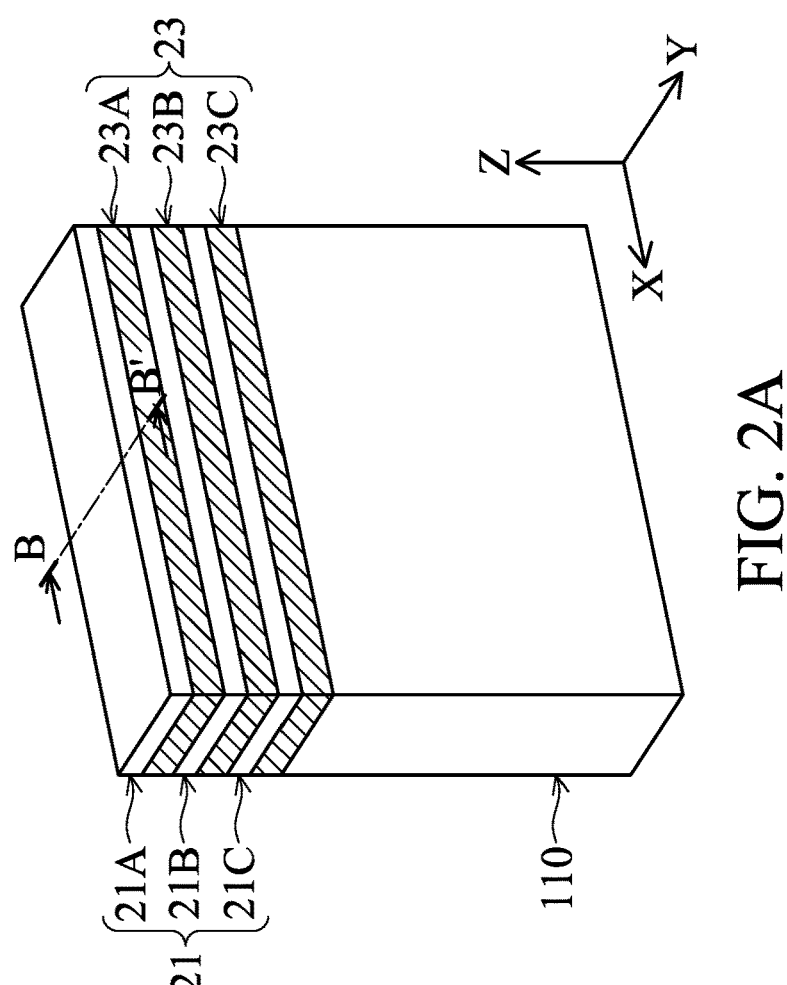

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nanostructure-FETs.

In FIG. 3A and FIG. 3B, fins 32 are formed in the substrate 110 and nanostructures 22, 24 are formed in the multi-layer stack 25 corresponding to act 1100 of FIG. 16. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24 are formed from the second semiconductor layers 23. Distance CD1 between adjacent fins 32 and nanostructures 22, 24 may be from about 18 nm to about 100 nm. A portion of the device 20 is illustrated in FIGS. 3A and 3B including two fins 32 for simplicity of illustration. The process 1000 illustrated in FIGS. 2A-15 may be extended to any number of fins, and is not limited to the two fins 32 shown in FIGS. 3A-15.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4B:
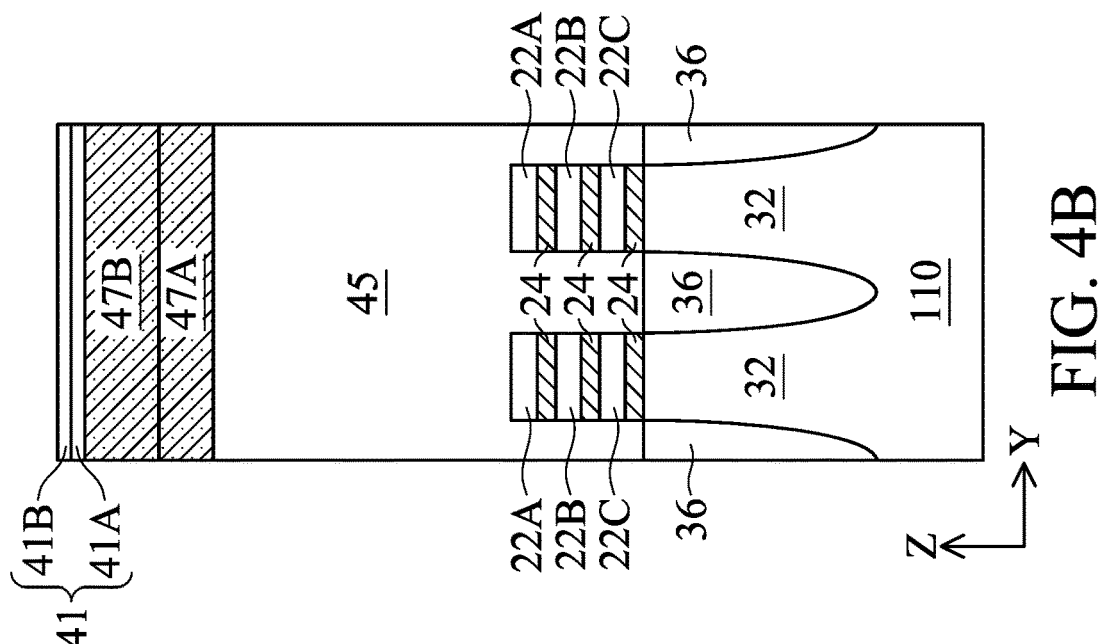
Figure 4A:
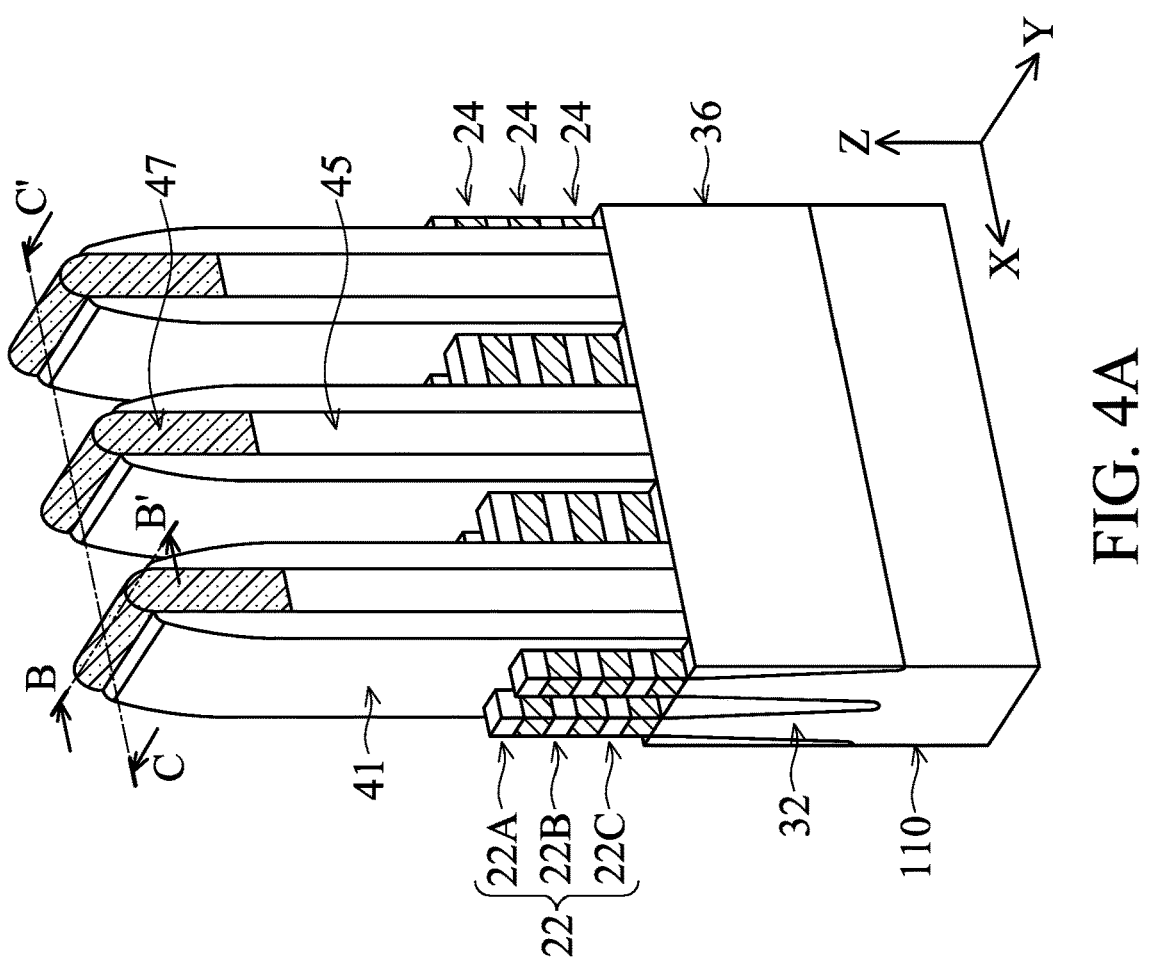
Figure 4C:
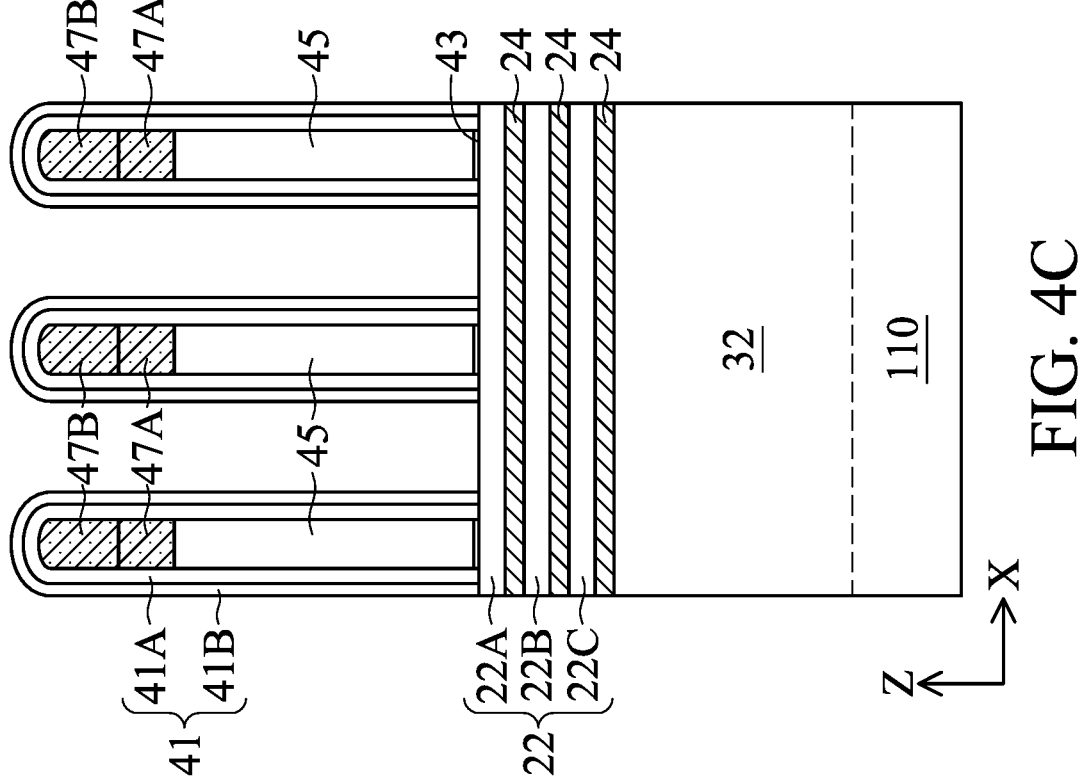

In FIGS. 4A-4C, dummy gate structures 40 are formed over the fins 32 and/or the nanostructures 22, 24, corresponding to act 1200 of FIG. 16. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24. In some embodiments, the mask layer 47 includes a first mask layer 47A in contact with the dummy gate layer 45, and a second mask layer 47B overlying the first mask layer 47A. The first mask layer 47A may be or include the same or different material as that of the second mask layer 47B.

A spacer layer 41 is formed over sidewalls of the mask layer 47 and the dummy gate layer 45, corresponding to act 1300 of FIG. 16. The spacer layer 41 is made of an insulating material, such as silicon nitride, silicon oxide, silicon carbonitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments. In some embodiments, the spacer layer 41 includes a first spacer layer 41A in contact with the nanostructure 22A, the gate dielectric layer 43, the dummy gate layer 45 and the first and second mask layers 47A, 47B. A second spacer layer 41B of the spacer layer 41 may be in contact with the first spacer layer 41A and the nanostructure 22A. The first spacer layer 41A may be or include the same or different material as that of the second spacer layer 41B.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

While not specifically illustrated in FIGS. 4A-4C, in some embodiments, the hybrid fins 94 are formed following formation of the isolation regions 36 and prior to formation of the dummy gate structures 40. The hybrid fins 94 may be formed in a self-aligned process by first depositing the liner layer 93 to cover the stacks of nanostructures 22, 24 shown in FIG. 4B, then depositing the fill layer 95 to fill remaining portions of openings between the stacks. Excess materials of the liner layer 93 and the fill layer 95 overlying the nanostructures 22A are then removed, for example, by a planarization process, such as a CMP. If included, the gate isolation structures 99 are then formed over the hybrid fins 94.

Figure 5B:
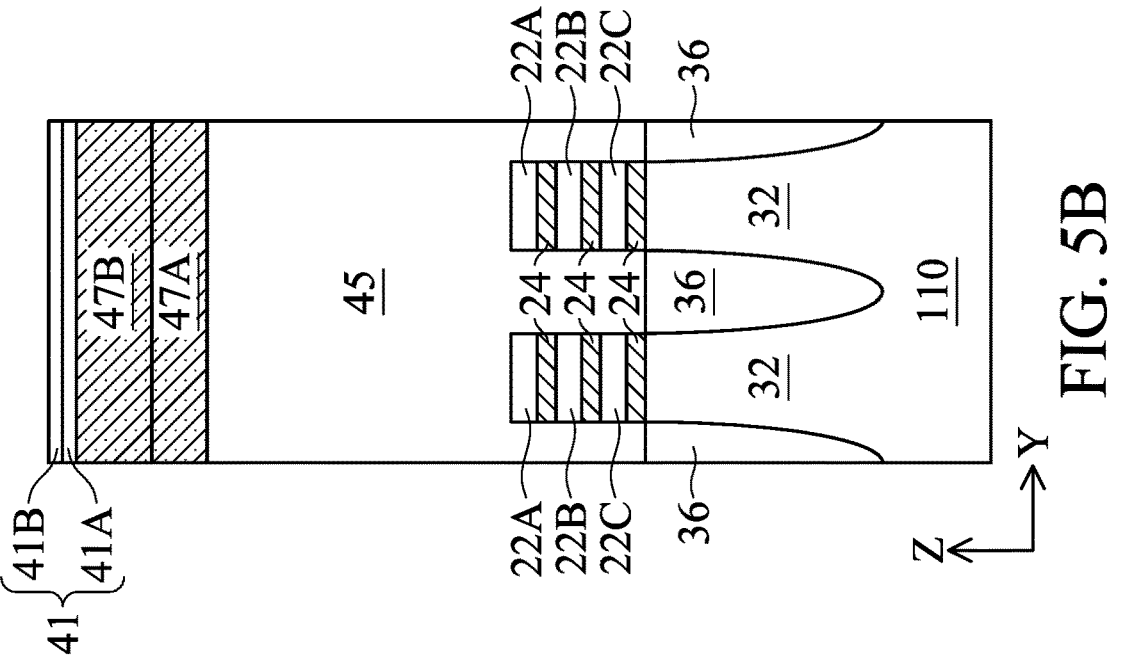
Figure 5A:
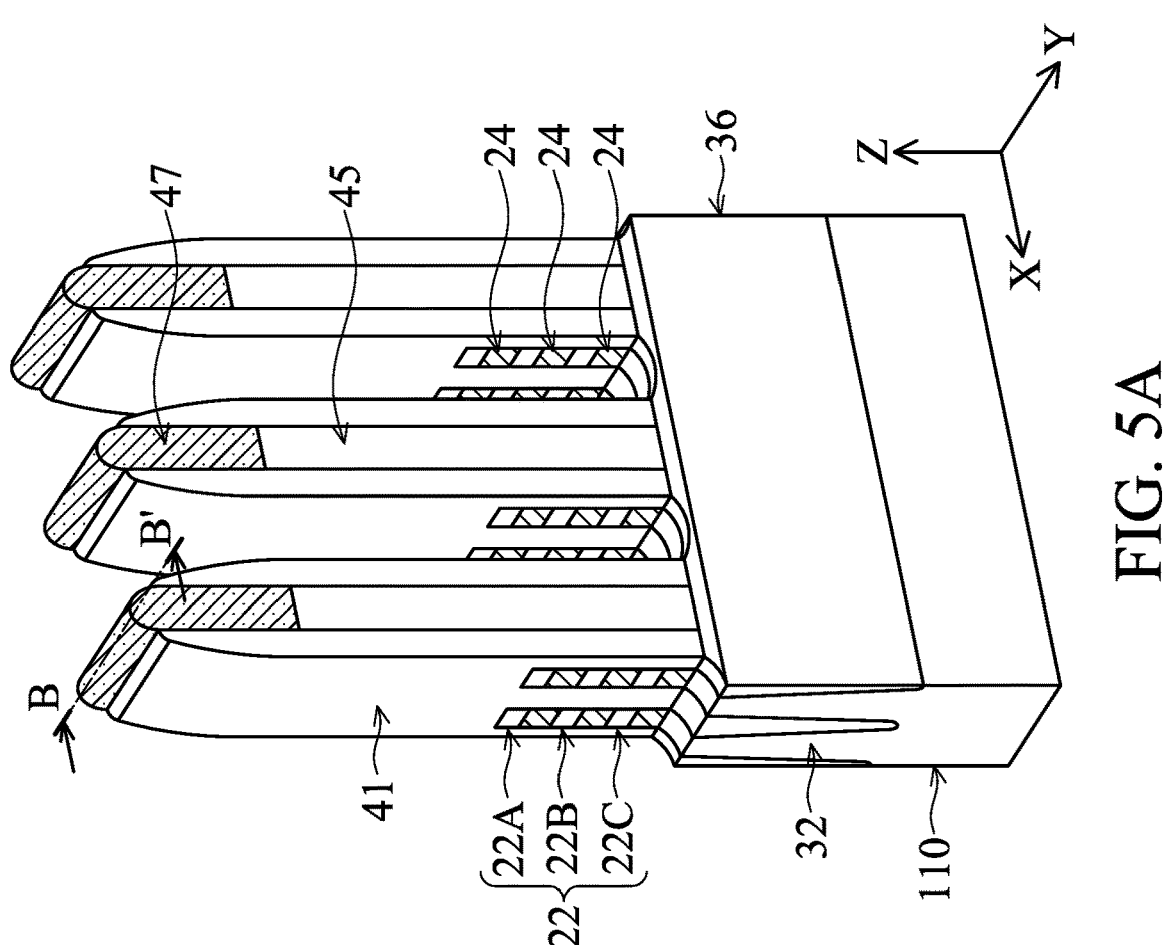
Figure 5C:
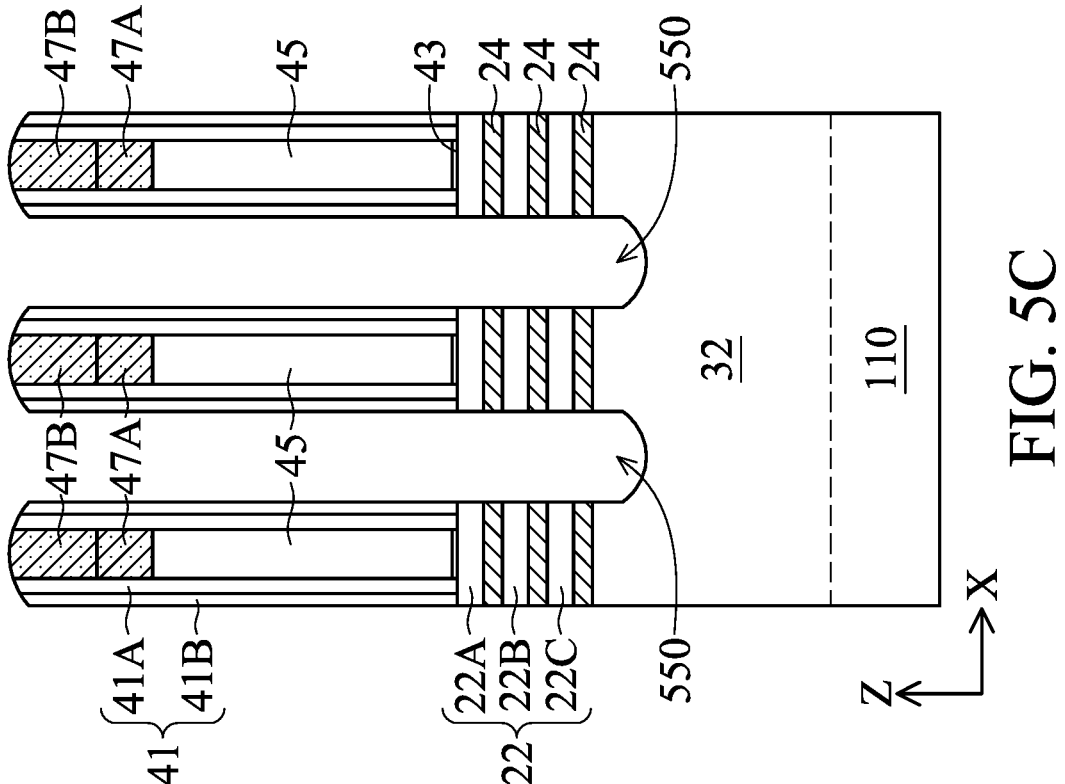

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows three vertical stacks of nanostructures 22, 24 following the etching process for simplicity. In general, the etching process may be used to form any number of vertical stacks of nanostructures 22, 24 over the fins 32. In some embodiments, the second mask layer 47B is exposed following the etching process, for example, due to removal of upper portions of the spacer layers 41A, 41B during the etching process.

Figure 6B:
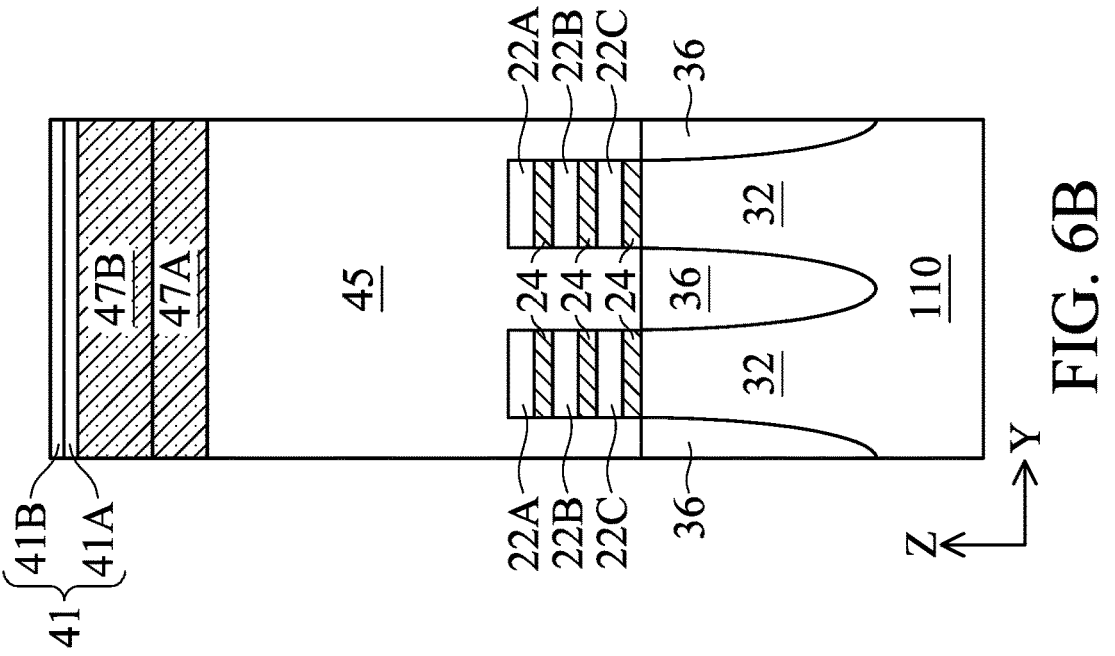
Figure 6A:
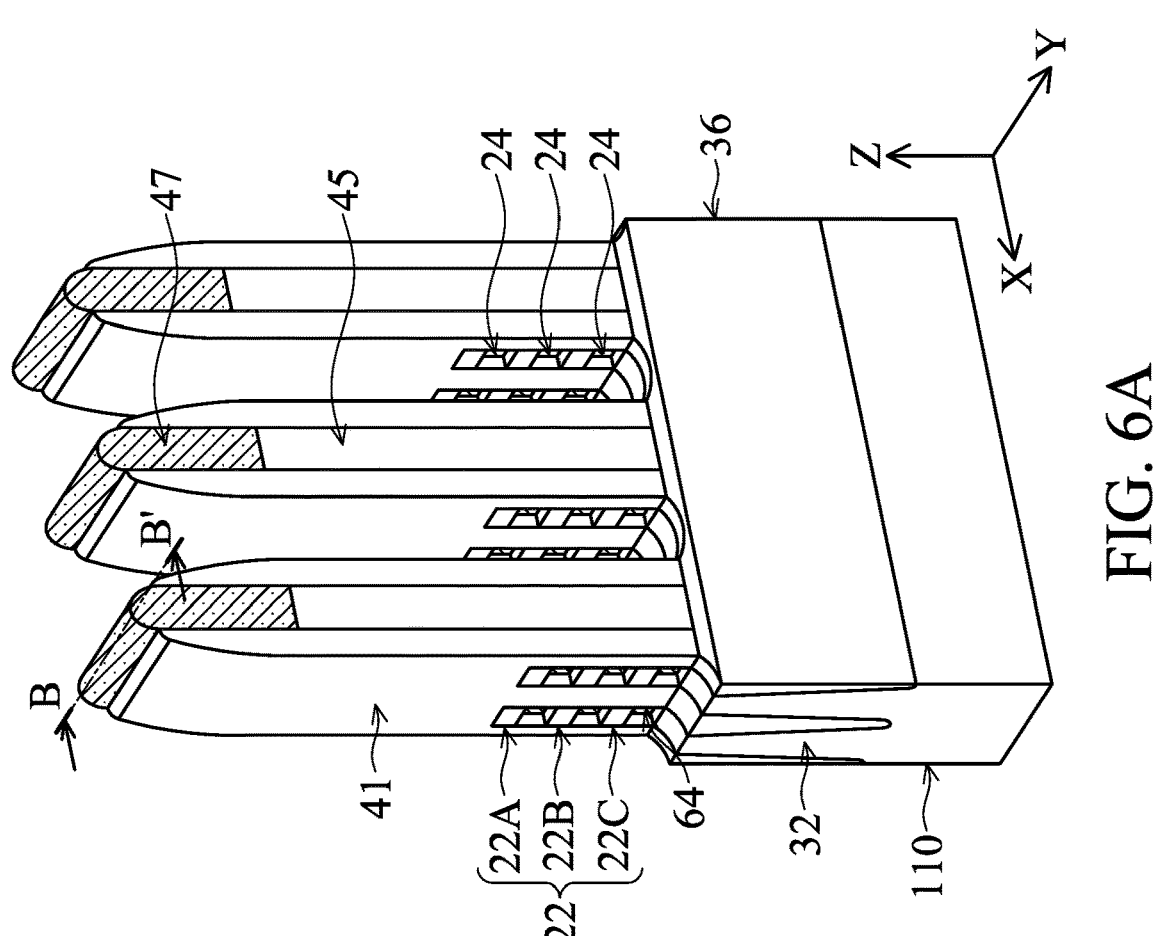
Figure 6D:
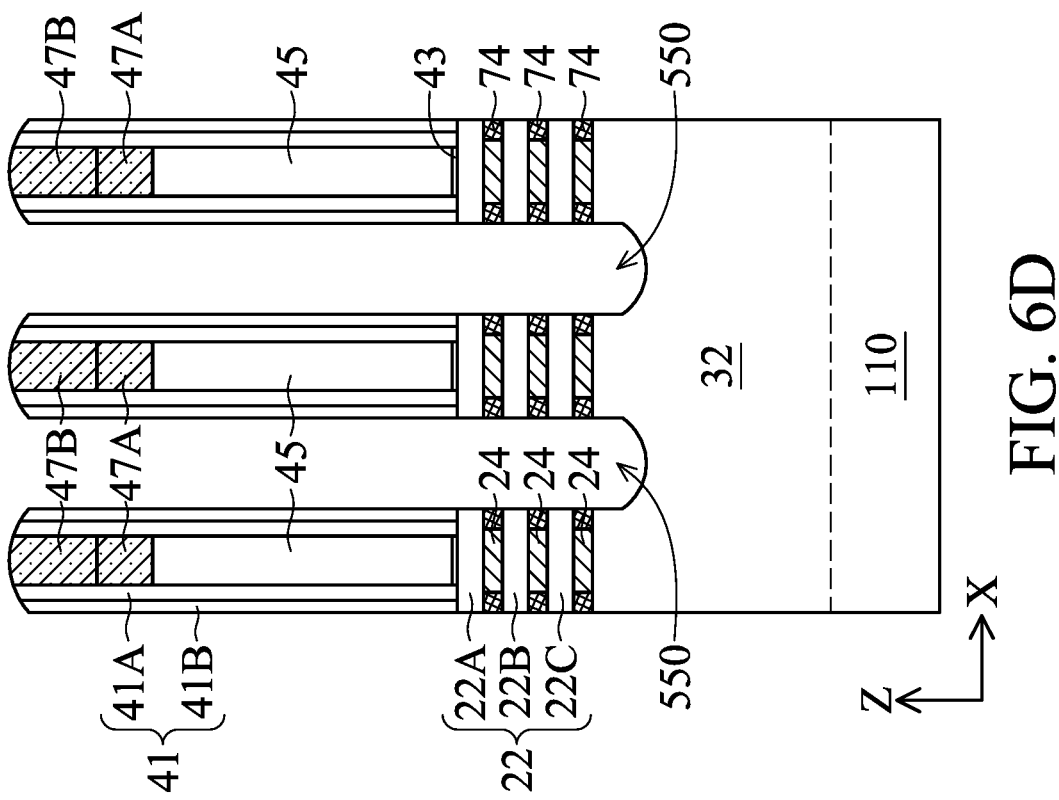
Figure 6C:
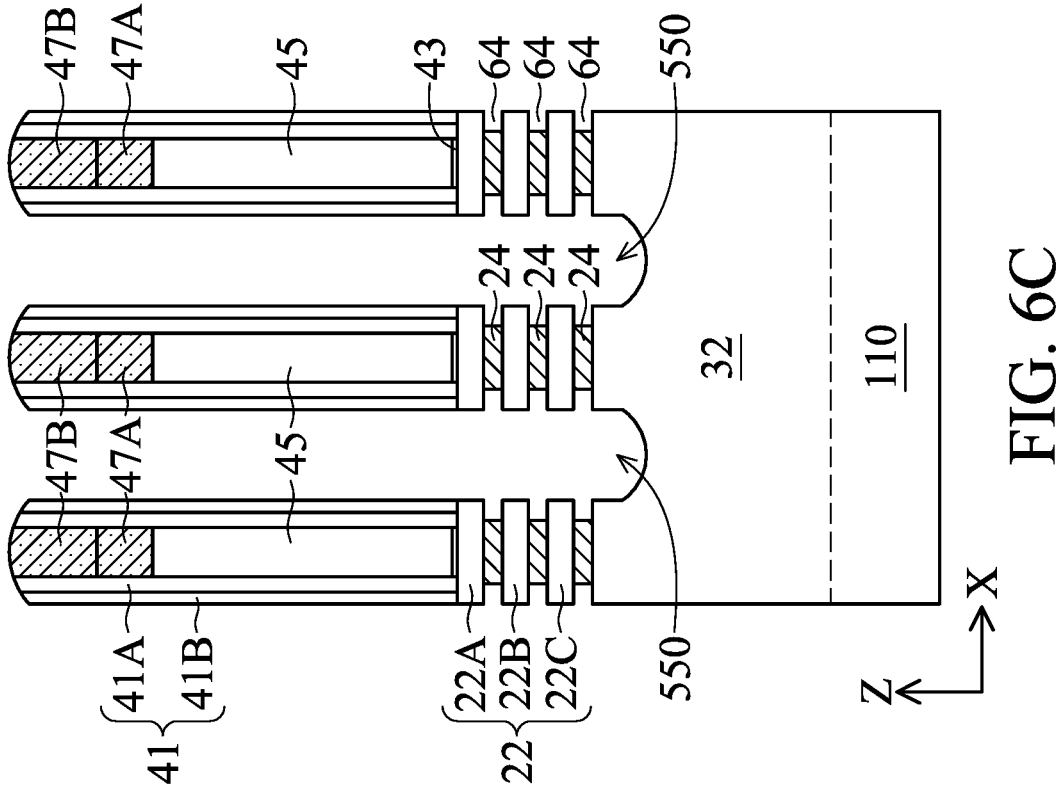

FIGS. 6A-6D illustrate formation of inner spacers 74, corresponding to act 1300 of FIG. 16. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A, 6C.

Referring to FIG. 6D, next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses 64 in the nanostructures 24. The remaining portions of the inner spacer layers (e.g., portions disposed inside the recesses 64 in the nanostructures 24) form the inner spacers 74. The resulting structure is shown in FIG. 6D.

FIGS. 7A-8B illustrate formation of source/drain regions 82, including N-type source/drain region 82N and P-type source/drain region 82P. In the illustrated embodiment, the source/drain regions 82N, 82P are epitaxially grown from epitaxial material(s). In some embodiments, the source/drain regions 82N, 82P exert stress in the respective channels 22A-22C, thereby improving performance. The source/drain regions 82N, 82P are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

Figure 7B:
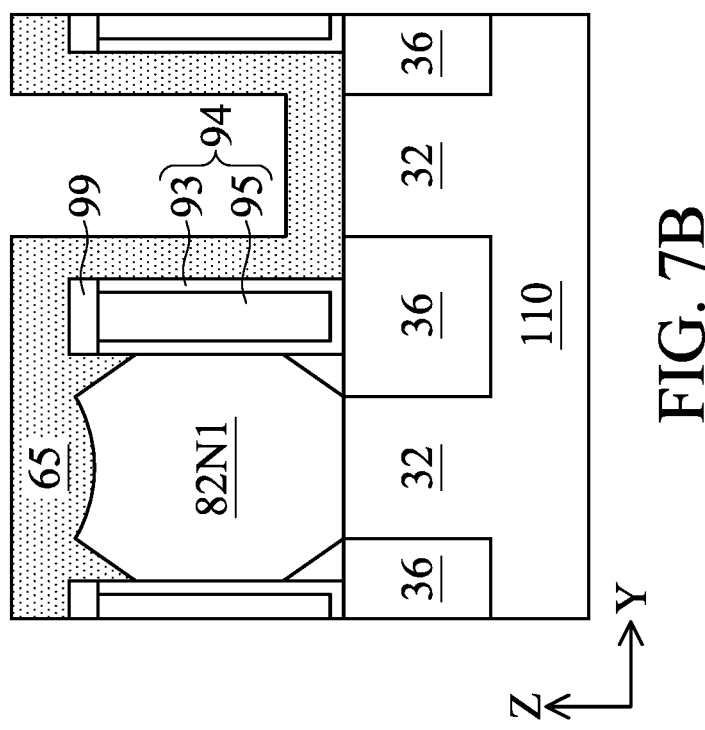
Figure 7A:
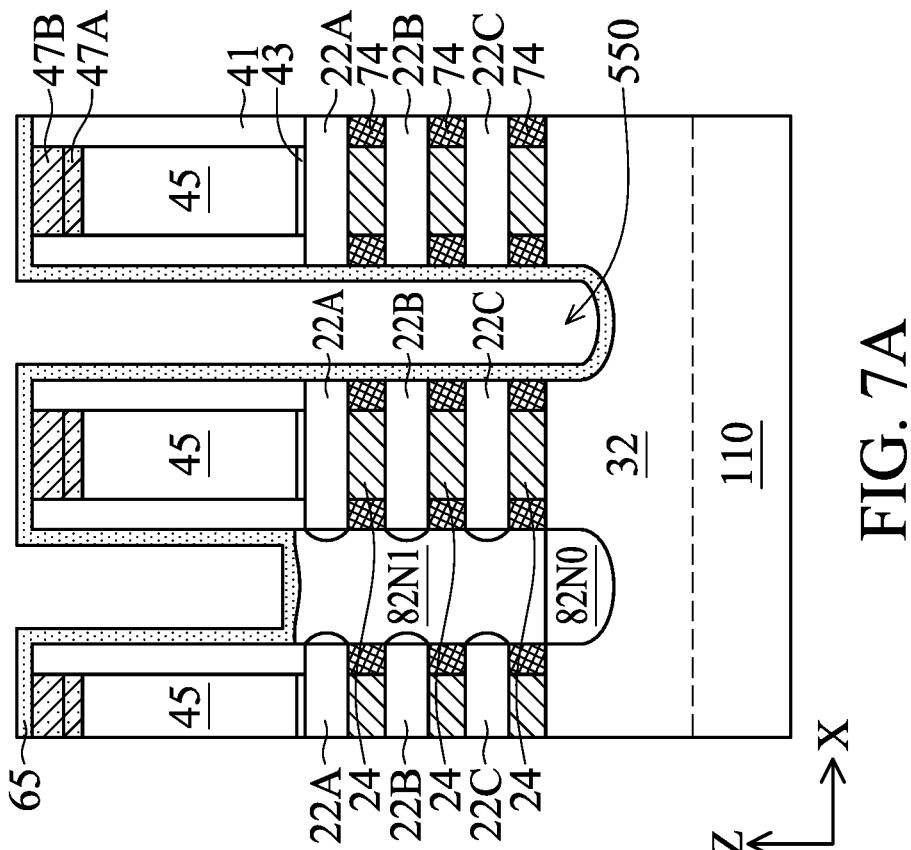

As shown in FIGS. 7A, 7B, the N-type source/drain region 82N may be formed prior to forming the P-type source/drain region 82P. In some embodiments, first N-type epitaxial regions 82N0 are grown in a first epitaxial process. The first N-type epitaxial regions 82N0 may be formed on exposed surfaces of the fin 32 in certain of the openings 550 (see FIG. 6D), while others of the openings 550 are masked. The first N-type epitaxial regions 82N0 are also formed on exposed surfaces of the nanostructures 22, and may not form substantially on the inner spacers 74. Following formation of the first N-type epitaxial regions 82N0 in the first epitaxial process, a second N-type epitaxial region 82N1 is formed in a second epitaxial process. In some embodiments, the second epitaxial process is different from the first epitaxial process, for example, in flow ratio of constituent gases, temperature, pressure or other suitable parameter. In some embodiments, a smooth transition is present between the first and second epitaxial processes, such that the first and second epitaxial regions 82N0, 82N1 may be formed without substantial disruption to flow of the constituent gases. The second N-type epitaxial region 82N1 may extend from an upper surface of the first epitaxial region 82N0 on the fin 32 to a level at or near upper surfaces of the nanostructures 22A. As shown in FIG. 7A, the second N-type epitaxial region 82N1 may extend to a level higher than the gate dielectric layer 43, and is in contact with the spacer layer 41. The second N-type epitaxial region 82N1 may have a concave upper surface, as shown, or a substantially flat or convex surface, in some embodiments. As described with reference to FIGS. 1A, 1B, the N-type epitaxial regions 82N0, 82N1 may be or include SiP, SiAs, SiSb, SiPAs, SiP:As:Sb or the like.

Following formation of the N-type source/drain region 82N, a second spacer layer 65 may be formed as a conformal thin layer covering the spacer layer 41, the hard mask layer 47, the N-type source/drain region 82N and exposed surfaces of the nanostructures 22, the fin 32 and the inner spacers 74 in the opening 550. The second spacer layer 65 protects the N-type source/drain region 82N in subsequent processes. In some embodiments, the second spacer layer 65 is or includes SiN, SiCN, SiOCN, SiO, a high-k dielectric material, or other suitable material. The second spacer layer 65 may be deposited to a thickness in a range of about 2 nm to about 6 nm. The second spacer layer 65 may be a front-end-of-line (FEOL) dielectric hard mask layer, and may be referred to as the dielectric hard mask layer 65.

Figure 7D:
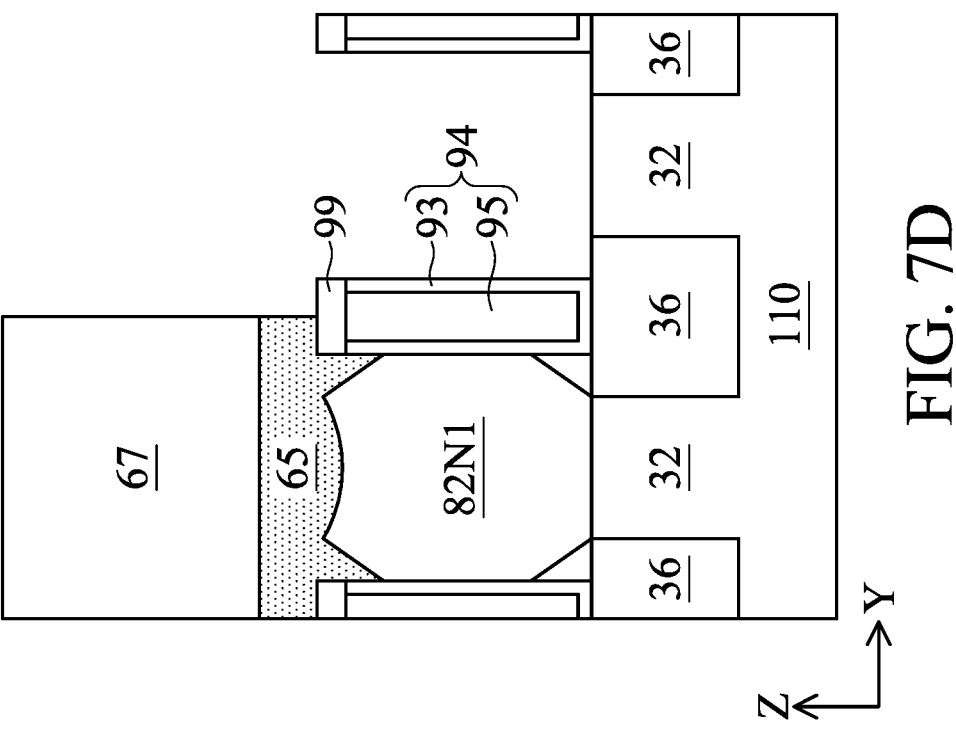
Figure 7C:
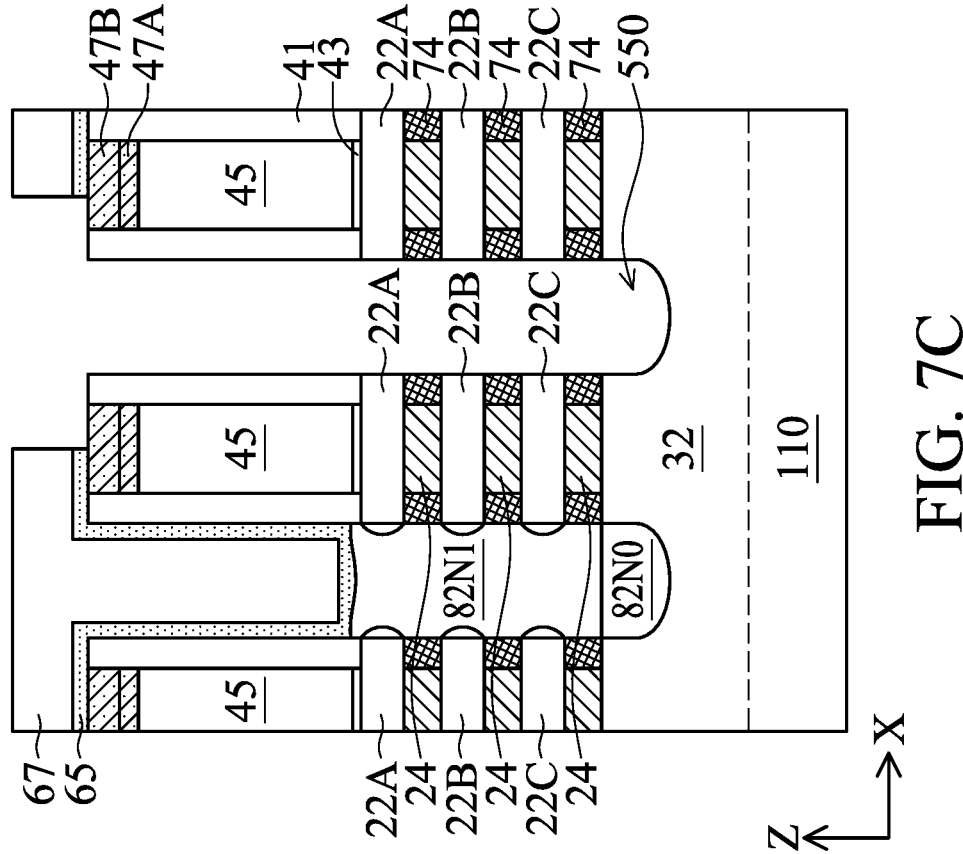
Figure 8B:
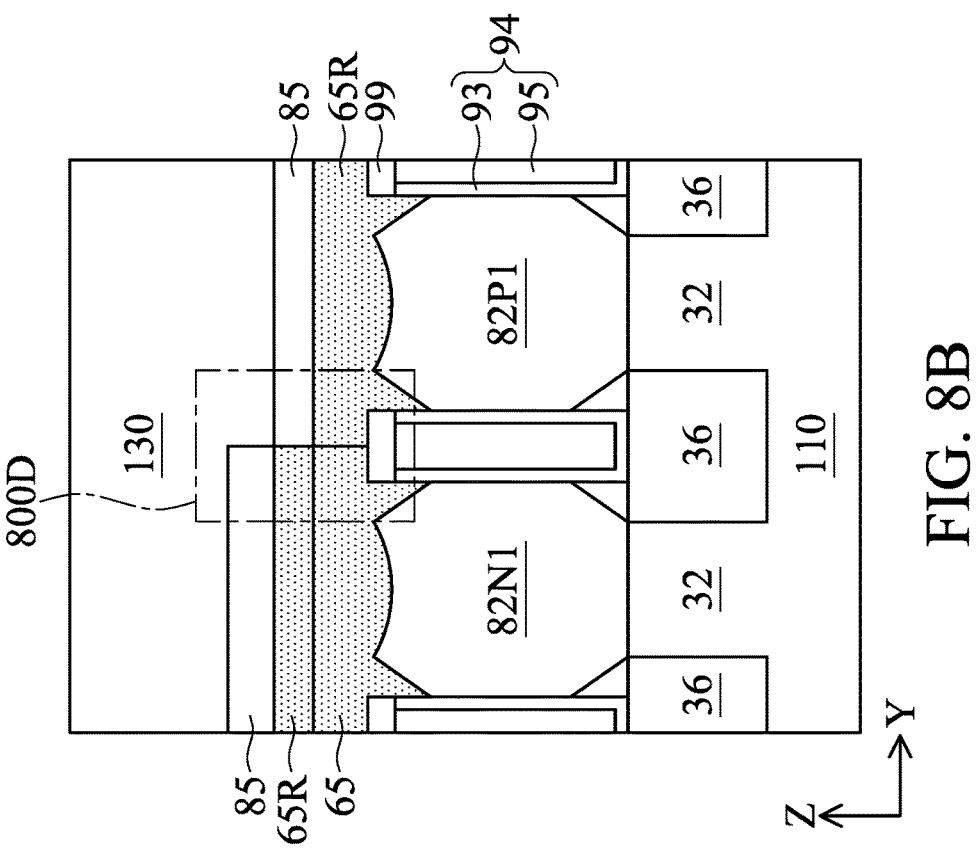
Figure 8A:
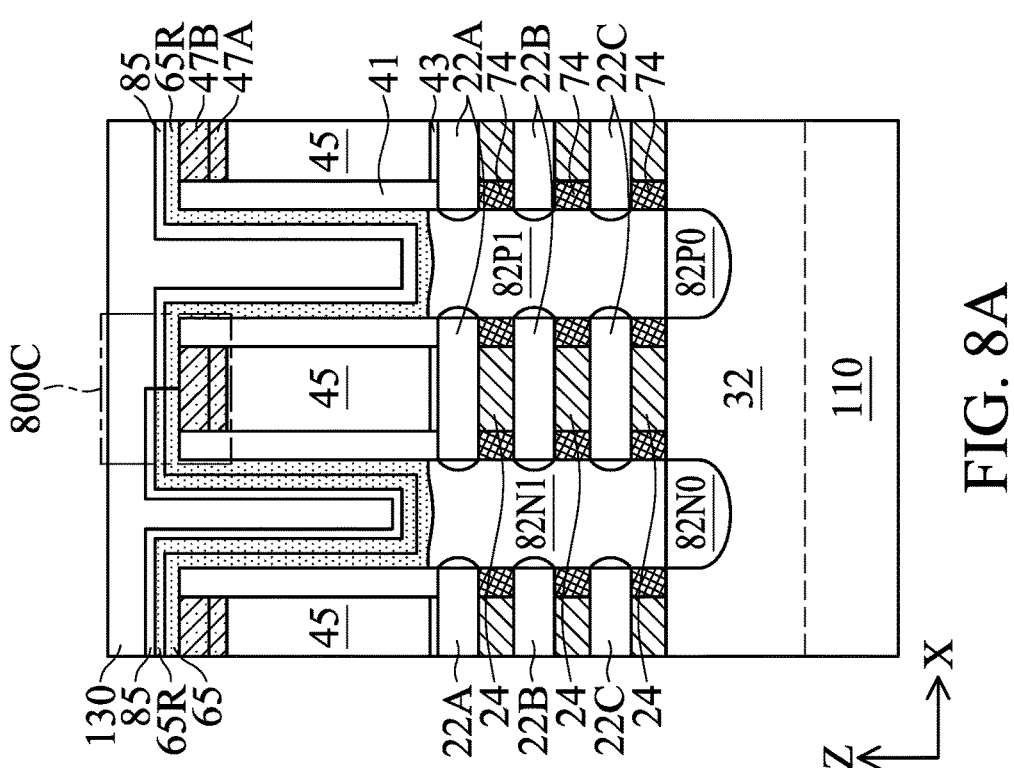

In FIGS. 7C, 7D, following formation of the second spacer layer 65, portions of the second spacer layer 65 overlying the opening 550 shown in FIGS. 7B, 7C are removed to restore the opening 550 and expose the fin 32 and nanostructures 22 for P-type epitaxial growth (see FIG. 8A, for example). In some embodiments, a photoresist layer 67 is formed and patterned to expose the opening 550 while masking the second spacer layer 65 over the N-type source/drain region 82N, as shown. Following formation and patterning of the photoresist layer 67, the exposed portions of the second spacer layer 65 are removed by, for example, a suitable etching process, such as an isotropic or anisotropic etch using etchants selective to materials of the second spacer layer 65 that do not substantially attack the underlying structure. The photoresist layer 67 may then be removed, for example, by ashing, rinsing, and/or other suitable removal method.

In FIGS. 8A, 8B, the P-type source/drain region 82P is formed in the opening 550 on exposed portions of the fin 32 and the nanostructures 22. The P-type source/drain region 82P may be formed following formation of the N-type source/drain region 82N. In some embodiments, first P-type epitaxial regions 82P0 are grown in a third epitaxial process. The first P-type epitaxial regions 82P0 may be formed on exposed surfaces of the fin 32 in certain of the openings 550 (see FIG. 7C), while others of the openings 550 in which the N-type source/drain regions 82N are formed are masked by the second spacer layer 65. The first P-type epitaxial regions 82P0 are also formed on exposed surfaces of the nanostructures 22, and may not form substantially on the inner spacers 74. Following formation of the first P-type epitaxial regions 82P0 in the third epitaxial process, a second P-type epitaxial region 82P1 is formed in a fourth epitaxial process. In some embodiments, the fourth epitaxial process is different from the third epitaxial process, for example, in flow ratio of constituent gases, temperature, pressure or other suitable parameter. In some embodiments, a smooth transition is present between the third and fourth epitaxial processes, such that the first and second epitaxial regions 82P0, 82P1 may be formed without substantial disruption to flow of the constituent gases. The second P-type epitaxial region 82P1 may extend from an upper surface of the first epitaxial region 82P0 on the fin 32 to a level at or near upper surfaces of the nanostructures 22A. As shown in FIG. 8A, the second P-type epitaxial region 82P1 may extend to a level higher than the gate dielectric layer 43, and is in contact with the spacer layer 41. The second P-type epitaxial region 82P1 may have a concave upper surface, as shown, or a substantially flat or convex surface, in some embodiments. As described with reference to FIGS. 1A, 1B, the P-type epitaxial regions 82P0, 82P1 may be or include SiGe:B, SiGe:B:Ga, SiGe:Sn, SiGe:B:Sn or the like. The source/drain region 82P materials may exert a compressive strain in the channel regions. The source/drain region 82P may have surfaces raised from respective surfaces of the fins and may have facets. Neighboring source/drain regions 82 may merge in some embodiments to form a singular source/drain region 82 adjacent two neighboring fins 32.

Figure 8D:
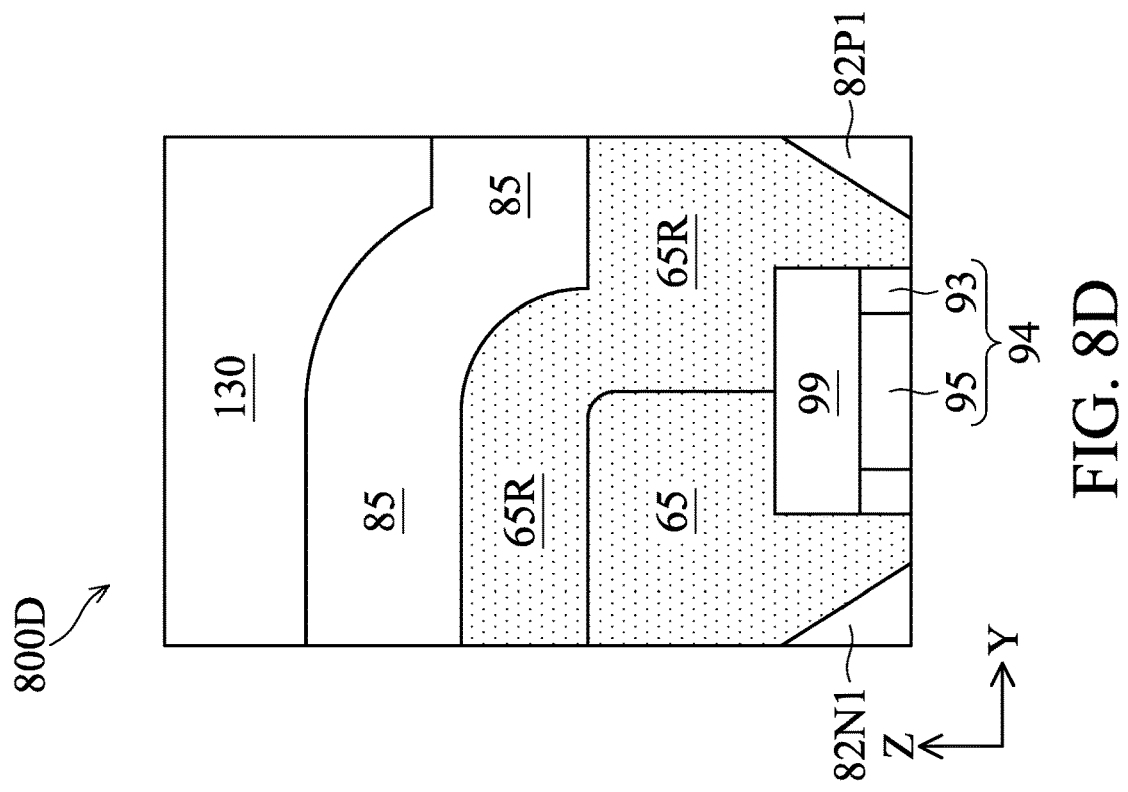
Figure 8C:
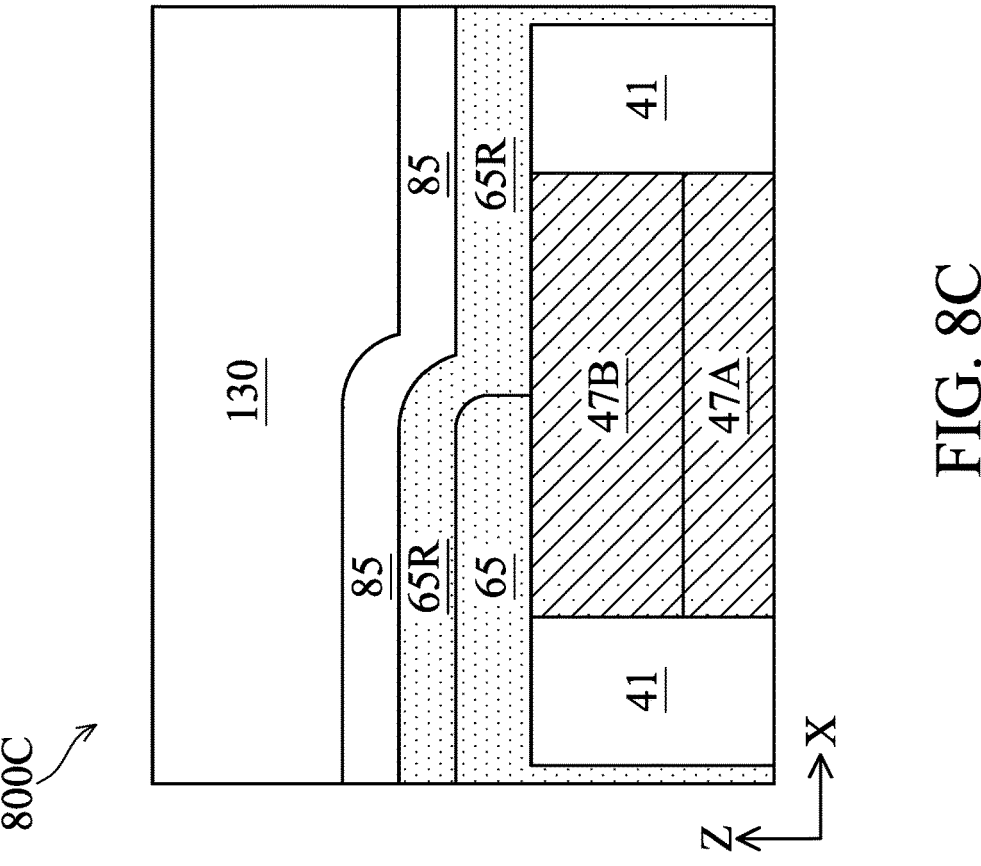

Following formation of the P-type source/drain region 82P, another second spacer layer 65R is formed as a conformal thin layer covering the second spacer layer 65 and the P-type source/drain region 82P, as shown in FIGS. 8A, 8B. The second spacer layer 65R may be similar in many respects to the second spacer layer 65. In some embodiments, the second spacer layer 65R is or includes SiN, SiCN, SiOCN, SiO, a high-k dielectric material, or other suitable material. The second spacer layer 65R may be deposited to a thickness in a range of about 2 nm to about 6 nm. As shown in FIGS. 8A, 8B, the second spacer layer 65R may be formed with a distinct step down at the end of the second spacer layer 65 in the highlighted regions 800C, 800D, such that the second spacer layer 65R is discontinuous on either side of the end of the second spacer layer 65. Referring to FIGS. 8C, 8D, in some embodiments, the second spacer layer 65R is continuous and exhibits a smooth transition at the end of the second spacer layer 65. The second spacer layer 65R may be an FEOL dielectric hard mask layer, and may be referred to as the second dielectric hard mask layer 65R.

Following formation of the second spacer layer 65R, a third spacer layer 85 is formed as a conformal thin layer over the second spacer layer 65R. In some embodiments, the third spacer layer 85 is formed by depositing a dielectric material, such as SiN, SiCN, SiOCN, SiO, a high-k dielectric material, or other suitable material. The third spacer layer 85 may be an FEOL dielectric hard mask layer, and may be referred to as the third dielectric hard mask layer 85. The third spacer layer 85 may be deposited to a thickness in a range of about 2 nm to about 6 nm. In some embodiments, the third spacer layer 85 is or comprises a different material than that of the second spacer layers 65, 65R. For example, the third spacer layer 85 may be a thin layer of SiCN, and one or more of the second spacer layers 65, 65R may be a thin layer of SiN. Formation of the second and third spacer layers 65, 65R, 85 corresponds to act 1400 of FIG. 16.

Following formation of the third spacer layer 85, the ILD 130 may be formed over the third spacer layer 85. In some embodiments, the ILD 130 is formed by deposition of a dielectric material, such as SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO or the like. The ILD 130 may have greater width over the P-type source/drain region 82P than over the N-type source/drain region 82N due to the presence of the second liner layer 65 over the N-type source/drain region 82N. The ILD 130 may have greater aspect ratio over the N-type source/drain region 82N than over the P-type source/drain region 82P. Aspect ratio may be related to ability of deposition processes to fill an opening without formation of voids. A greater aspect ratio is generally related to greater difficulty in filling openings. As such, if any of the spacer layers 65, 65R, 85 is formed to thickness greater than about 6 nm, aspect ratio and difficulty in forming the ILD 130 without voids may be increased, for example, to a degree at which known deposition processes are unable to achieve. Another reason for keeping thickness of the spacer layers 65, 65R, 85 below about 6 nm per layer is to avoid completely filling the openings over the source/drain regions 82 with the spacer layers 65, 65R, 85 and not leaving room to fill in the ILD 130.

As shown in FIGS. 8A, 8B, the third spacer layer 85 may be formed with a distinct step down at the end of the second spacer layer 65R in the highlighted regions 800C, 800D, such that the third spacer layer 85 is discontinuous on either side of the end of the second spacer layer 65R. Referring to FIGS. 8C, 8D, in some embodiments, the third spacer layer 85 is continuous and exhibits a smooth transition at the end of the second spacer layer 65R.

FIGS. 9A-9D illustrate formation of active gate structures 200, corresponding to act 1500 of FIG. 16. Channels 22A-22C are released by removal of the nanostructures 24, the mask layer 47, and the dummy gate layer 45. A planarization process, such as a CMP, is performed to level the top surfaces of the dummy gate layer 45 and gate spacer layer 41. The planarization process may also remove the mask layer 47 on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 15:
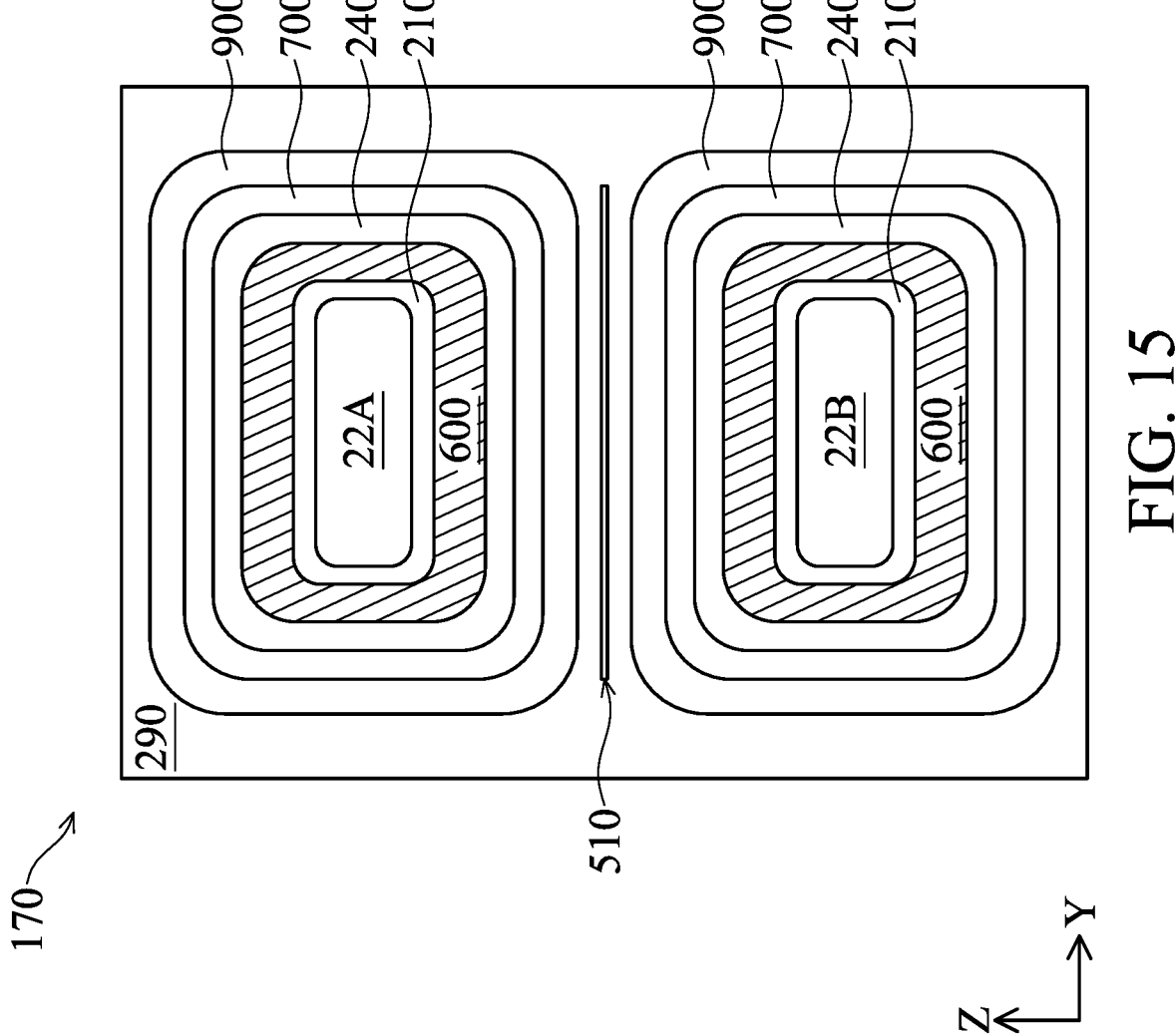

Replacement gates 200 are then formed. FIG. 15 is a detailed view of a portion of the gate structure 200. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 15, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 15, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses $HfCl_4$ and/or $H_2O$ as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20.

With further reference to FIG. 15, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments.

In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of WCl$_5$, followed by an Ar purge, followed by a second pulse of O$_2$, followed by another Ar purge. The high-k capping layer is removed to increase gate fill window for further multiple threshold voltage tuning by metal gate patterning.

Further in FIG. 15, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 15 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

In FIGS. 9A-9D, following formation of the gate structures 200, overlying the gate dielectric layer 600 and the gate fill layer 290 are a first capping layer 204 and a second capping layer 295. The first capping layer 204 protects the gate structure 200. In some embodiments, the first capping layer 204 is or includes a dielectric material, such as SiO$_2$, SiN, SiCN, SiOCN, a high-k dielectric material (e.g., Al$_2$O$_3$), or the like. The first capping layer 204 may prevent current leakage following one or more etching operations, which may be performed to form gate contacts, source/drain contacts 120, isolation structures (e.g., source/drain contact isolation structures), or the like. In some embodiments, the first capping layer 204 is or comprises a dielectric material that is harder than, for example, the second capping layer 295, such as aluminum oxide, or other suitable dielectric material.

The second capping layer 295, also referred to as a "self-aligned capping" (SAC) layer, may provide protection to the underlying gate structure 200, and may also act as a CMP stop layer when planarizing the source/drain contacts 120 following formation thereof. The second capping layer 295 may be a dielectric layer including a dielectric material, such as SiO$_2$, SiN, SiCN, SiC, SiOC, SiOCN, HfO$_2$, ZrO$_2$, ZrAlO$_x$, HfAlO$_x$, HfSiO$_x$, Al$_2$O$_3$, BN, or other suitable dielectric material. In some embodiments, over longer gate structures and channels, the second capping layer 295 may be split by a support structure. In some embodiments, width (X direction) of the second capping layer 295 is in a range of about 8 nm to about 40 nm.

In FIGS. 9A-9D, the upper surface of the P-type source/drain region 82P is exposed by removing portions of the ILD 130, the third spacer layer 85 and the second spacer layer 65R overlying the P-type source/drain region 82P, corresponding to act 1600 of FIG. 16. In some embodiments, a patterned masking layer 98 is used to expose the source/drain regions 82 while protecting other regions of the device 20. The N-type source/drain region 82N is protected by the second spacer layers 65, 65R during formation of a contact opening 950 over the P-type source/drain region 82P. In some embodiments, formation of the contact opening 950 includes one or more etching processes that remove the horizontal (X-Y plane) portions of the second and third spacer layers 65R, 85 overlying the P-type source/drain region 82P. During etching of the third spacer layer 85, sidewalls (vertical portions) of the third spacer layer 85 may be trimmed (e.g., thinned) over the P-type source/drain region 82P as shown. Over the N-type source/drain region 82N, horizontal portions of the third spacer layer 85 may be completely removed. Depending on how narrow the opening over the N-type source/drain region 82N is, both the second spacer layers 65, 65R may remain following formation of the contact opening 950. As such, the N-type source/drain region 82N is protected by the second spacer layers 65, 65R.

Figures 9A, 9B:
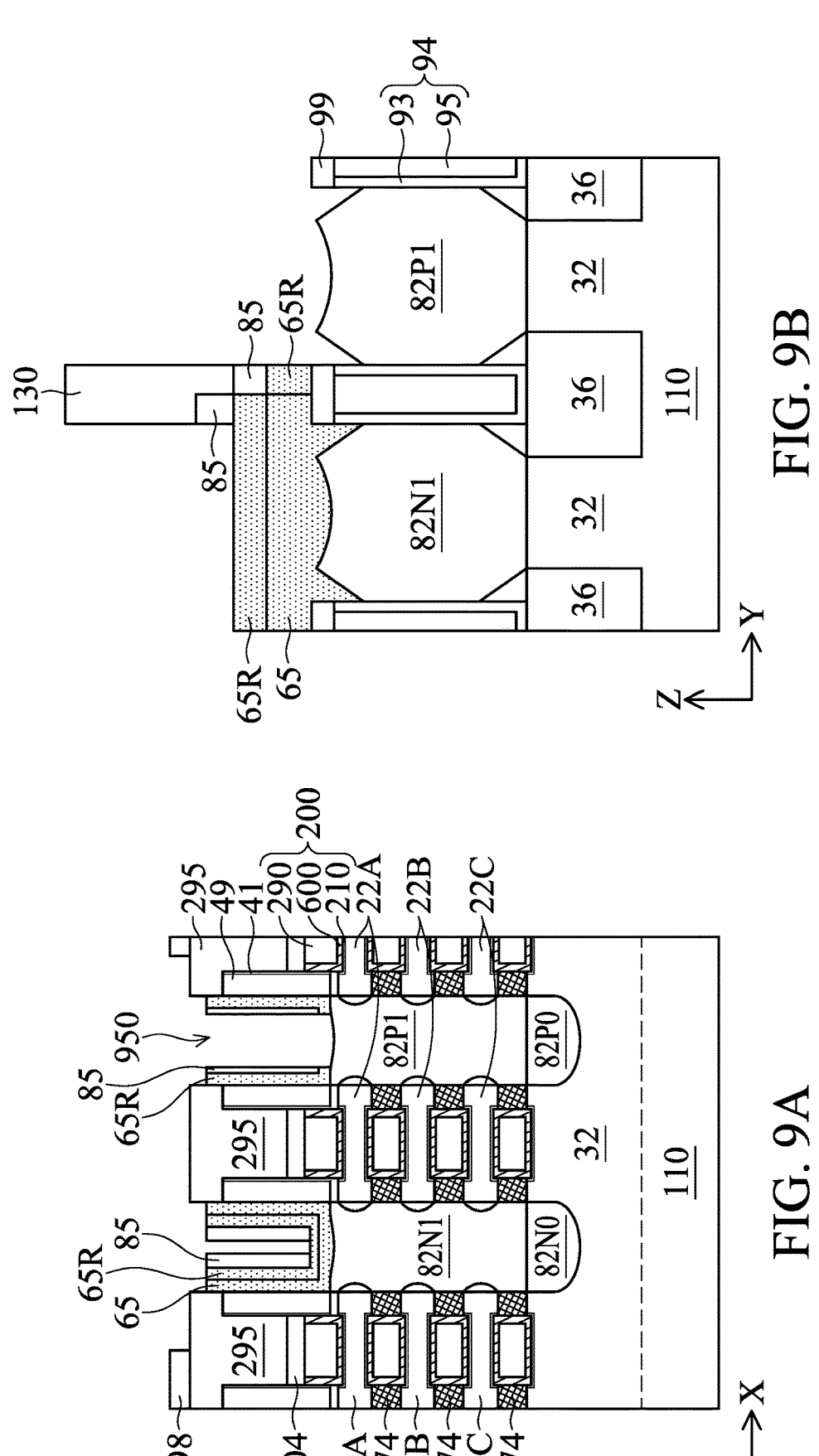
Figures 9C, 9D:
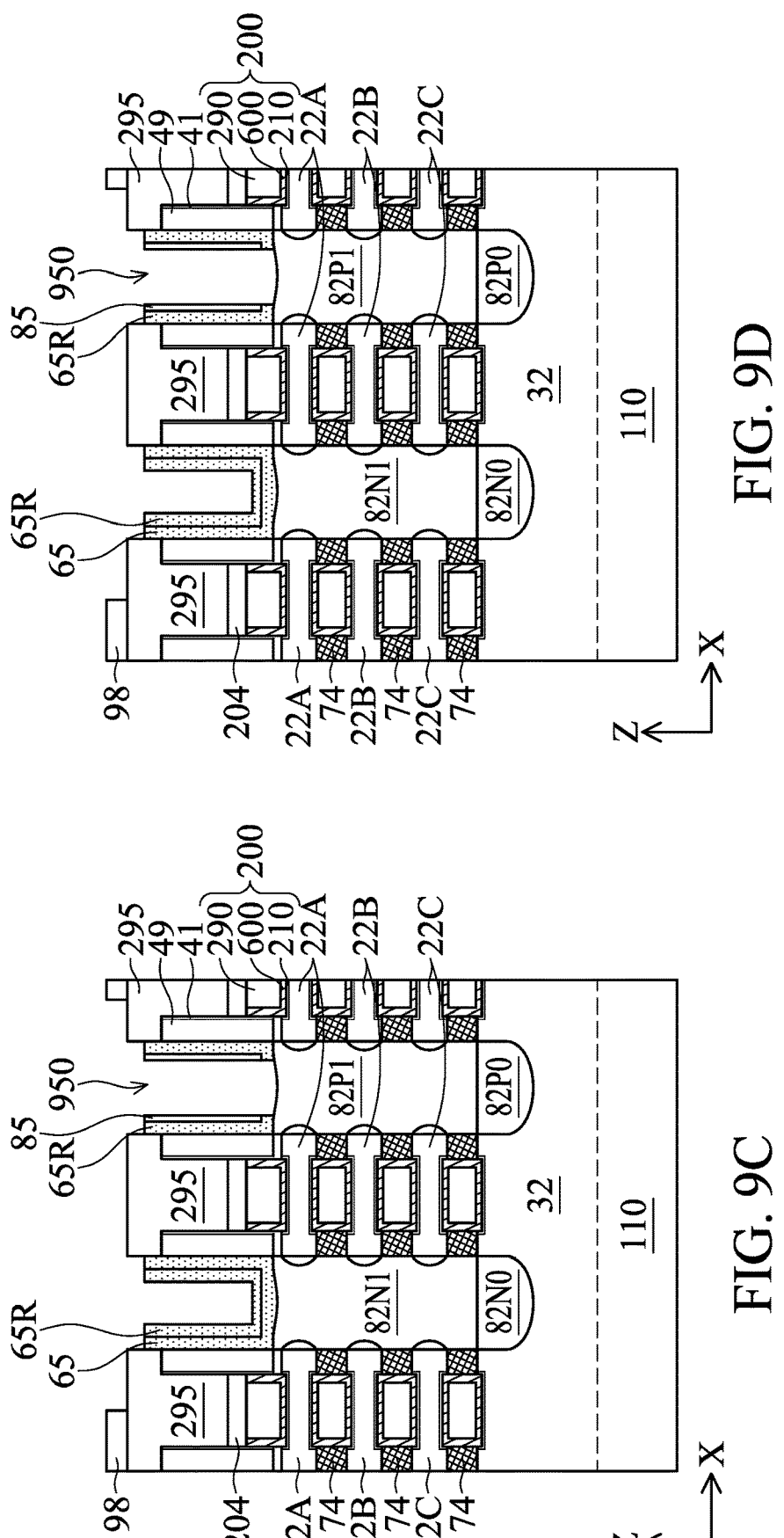

FIGS. 9C, 9D illustrate the formation of the contact opening 950 in accordance with embodiments in which the third spacer layer 85 is completely removed over the N-type source/drain region 82N (FIG. 9C and FIG. 9D), and horizontal portions of the second spacer layer 65R are removed (FIG. 9D). As shown in FIG. 9C, the third spacer layer 85 may be completely removed over the N-type source/drain region 82N while the second spacer layers 65, 65R are substantially intact following formation of the contact opening 950. As such, the opening over the N-type source/drain region 82N may be wider than that shown in FIG. 9A, while the N-type source/drain region 82N is still protected by both the second spacer layers 65, 65R in subsequent processes. In FIG. 9D, the horizontal portion of the second spacer layer 65R is removed while leaving the second spacer layer 65 substantially intact, such that the N-type source/drain region 82N is protected by the second spacer layer 65. In some embodiments, the second spacer layer 65 is thinned slightly during formation of the contact opening 950.

Figures 10A, 10B:
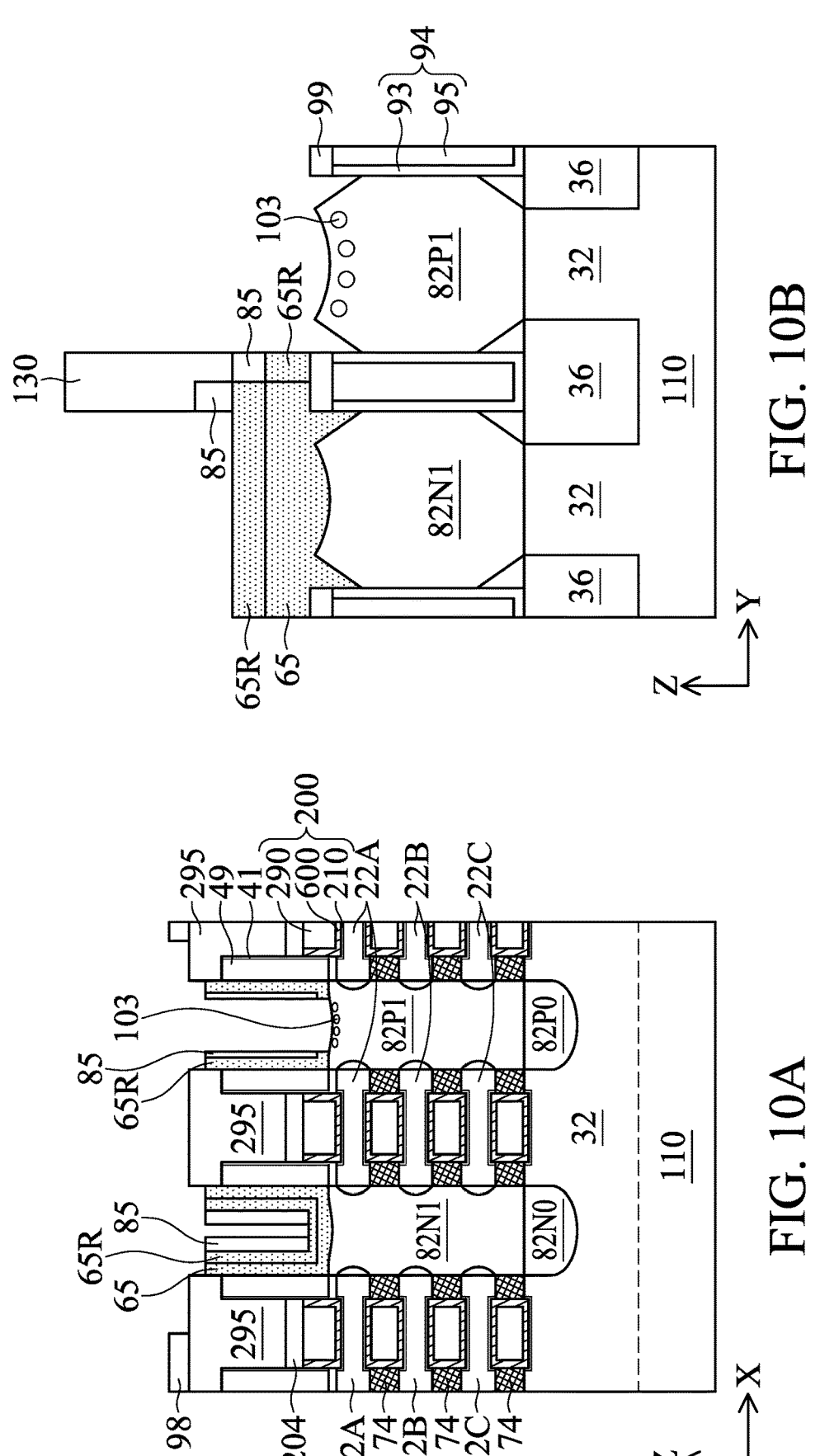

In FIGS. 10A, 10B, the P-type source/drain region 82P is implanted with dopants 103, which may be optionally followed by an anneal. The dopants 103 may include P-type implants, such as Ga, B, C, Sn or the like, implanted to a depth in a range of about 3 nm to about 10 nm, at a concentration in a range of about $10^{18}$ cm$^{-3}$ to about $10^{21}$ cm$^{-3}$. Generally, the implantation process is performed globally, such that the P-type implants are implanted into the P-type source/drain region 82P, and may also be implanted into exposed regions of the second spacer layers 65, 65R, the second capping layer 295 and the ILD 130. Implanting the dopants 103 improves activation of the P-type source/drain region 82P. By using the spacer layers 65, 65R, 85 already in place over the N-type source/drain region 82N, additional photolithography operations to perform the implant may be obviated, which saves significant cost and reduces process complexity.

Figures 11A, 11B:
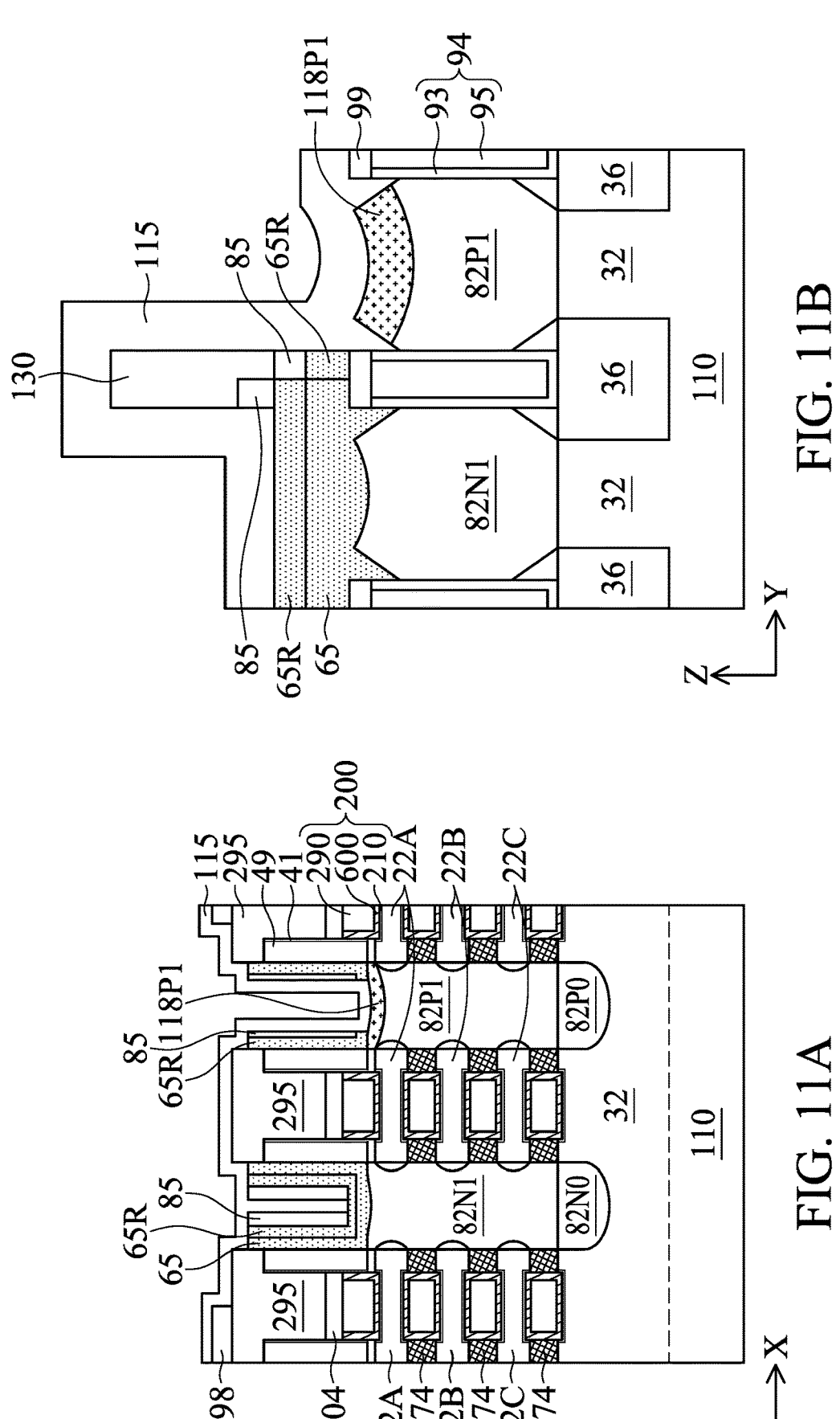
Figure 11C:
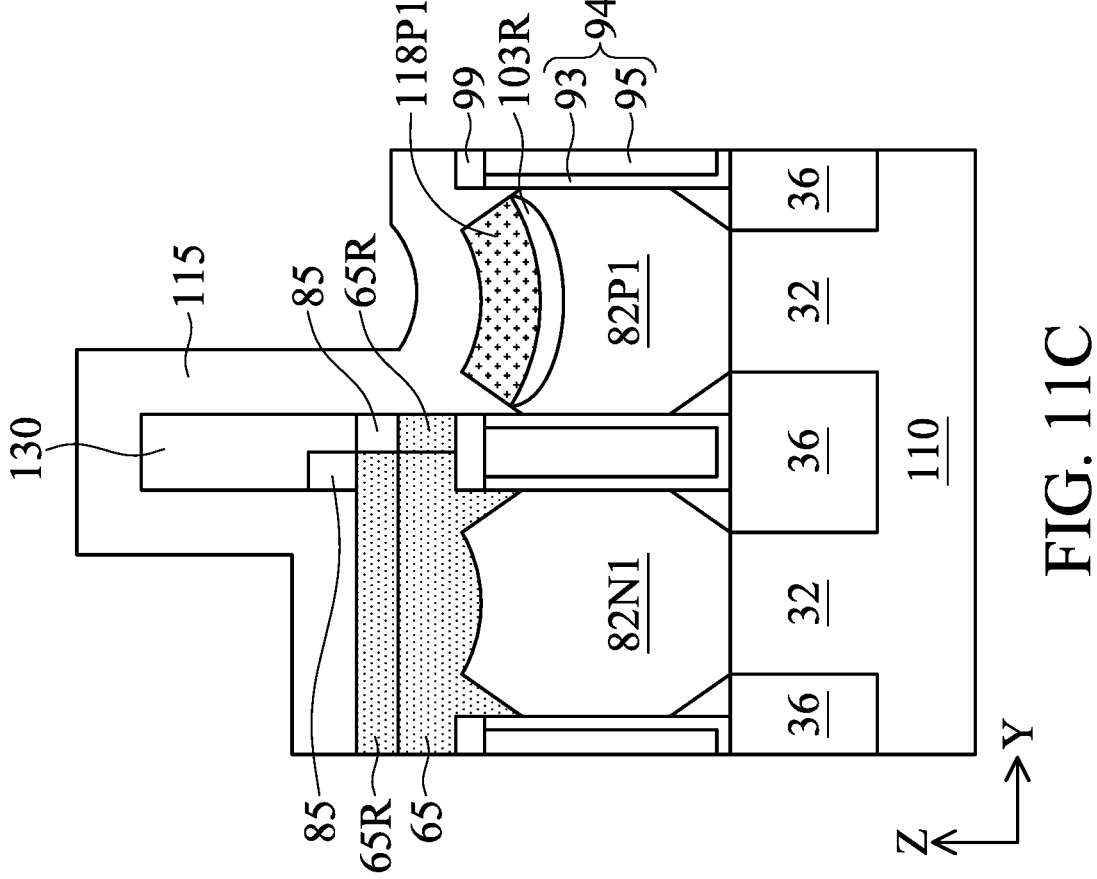

In FIGS. 11A-11C, the first silicide layer 118P1 (or "P work function silicide") is formed in the P-type source/drain region 82P, corresponding to act 2100 of FIG. 17. In some embodiments, a P-type metal layer 115 is formed as a conformal thin layer over exposed portions of the second P-type epitaxial region 82P1. The P-type metal layer 115 may be formed over exposed portions of the spacer layers 65, 65R, 85, the ILD 130, the second capping layers 295 and the gate isolation structures 99. The P-type metal layer 115 may be or include one or more of Ni, Co, Mn, W, Fe, Rh, Pd, Ru, Pt, Ir, Os or the like.

Following formation of the P-type metal layer 115, the first silicide layer 118P1 may be formed by annealing the device 20 with the P-type metal layer 115 in contact with the second P-type epitaxial region 82P1. Following the anneal, the first silicide layer 118P1 may be or include NiSi, CoSi, MnSi, WSi, FeSi, RhSi, PdSi, RuSi, PtSi, IrSi, OsSi or the like. Silicide of the first silicide layer 118P1 may diffuse in regions below the spacer layers 85, 65R, as shown in FIG. 11A. Thickness of the first silicide layer 118P1 may be in a range of about 1 nm to about 10 nm. Below about 1 nm, contact resistance at the P-type source/drain region 82P may be too high. Above about 10 nm, the first silicide layer 118P1 may short with the channels 22A.

Referring to FIG. 11C, in some embodiments, the P+ implanted region of the P-type source/drain region 82P may not react completely with the P-type metal layer 115 to form the first silicide layer 118P1. As such, a P+ doped region 103R may remain under the first silicide layer 118P1, as shown.

Figure 12B:
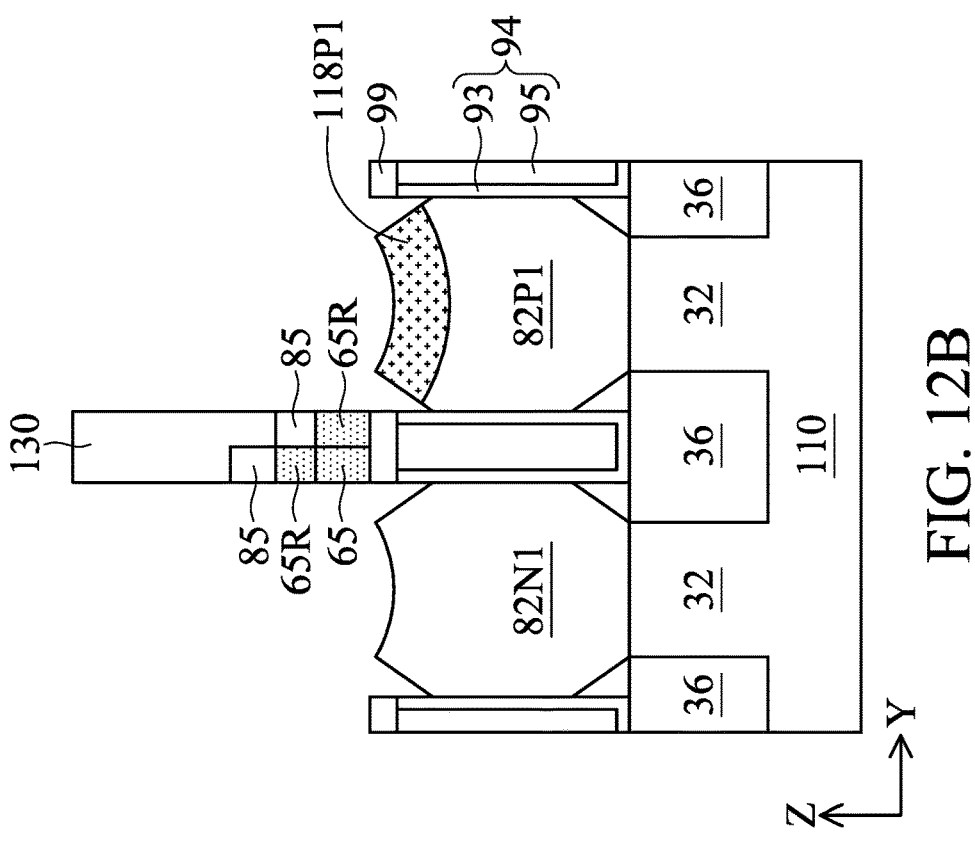
Figure 12A:
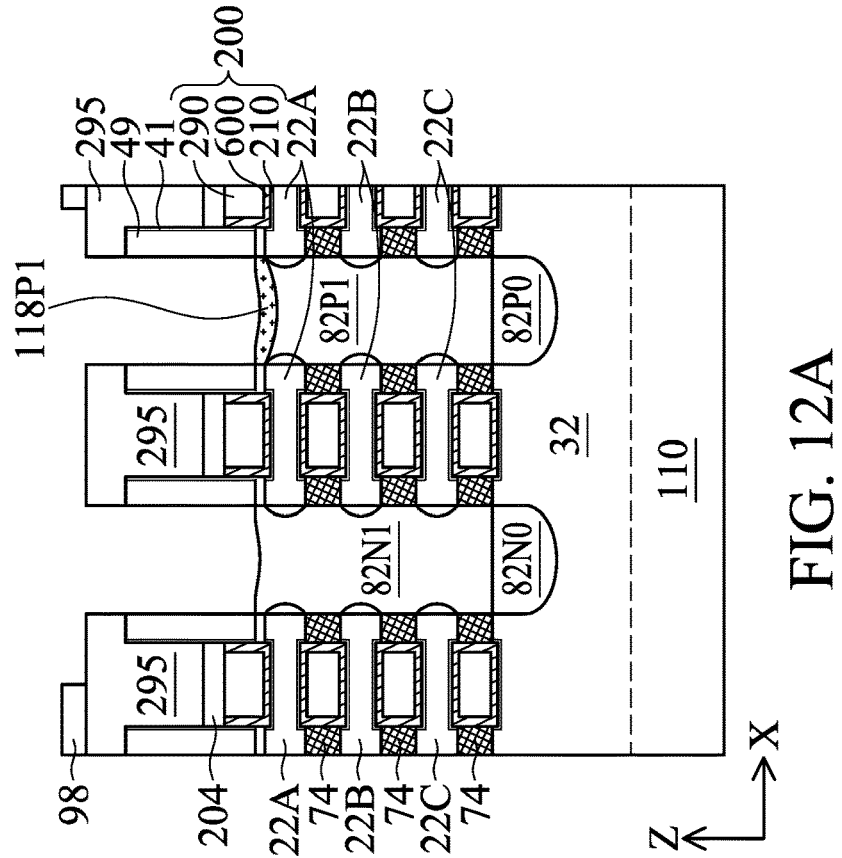

In FIGS. 12A, 12B, following formation of the first silicide layer 118P1, unreacted portions of the P-type metal layer 115 are removed, followed by removal of remaining portions of the spacer layers 65, 65R, 85, exposing the N-type source/drain region 82N, corresponding to act 2200 of FIG. 17. The removal of the spacer layers 65, 65R, 85 over the source/drain regions 82 is in preparation for subsequent silicide formation. By removing the spacer layers 65, 65R, 85, which are thicker over the N-type source/drain region 82N than over the P-type source/drain region 82P, width of the silicide layers to be formed in subsequent processing may be substantially the same. Removal of the unreacted portions of the P-type metal layer 115 and the spacer layers 65, 65R, 85 may include one or more etching operations selective to each of the layers to be removed. As shown in FIG. 12B, portions of the spacer layers 65, 65R, 85 underlying the ILD 130 may remain following the removal operation.

Figures 13A, 13B:
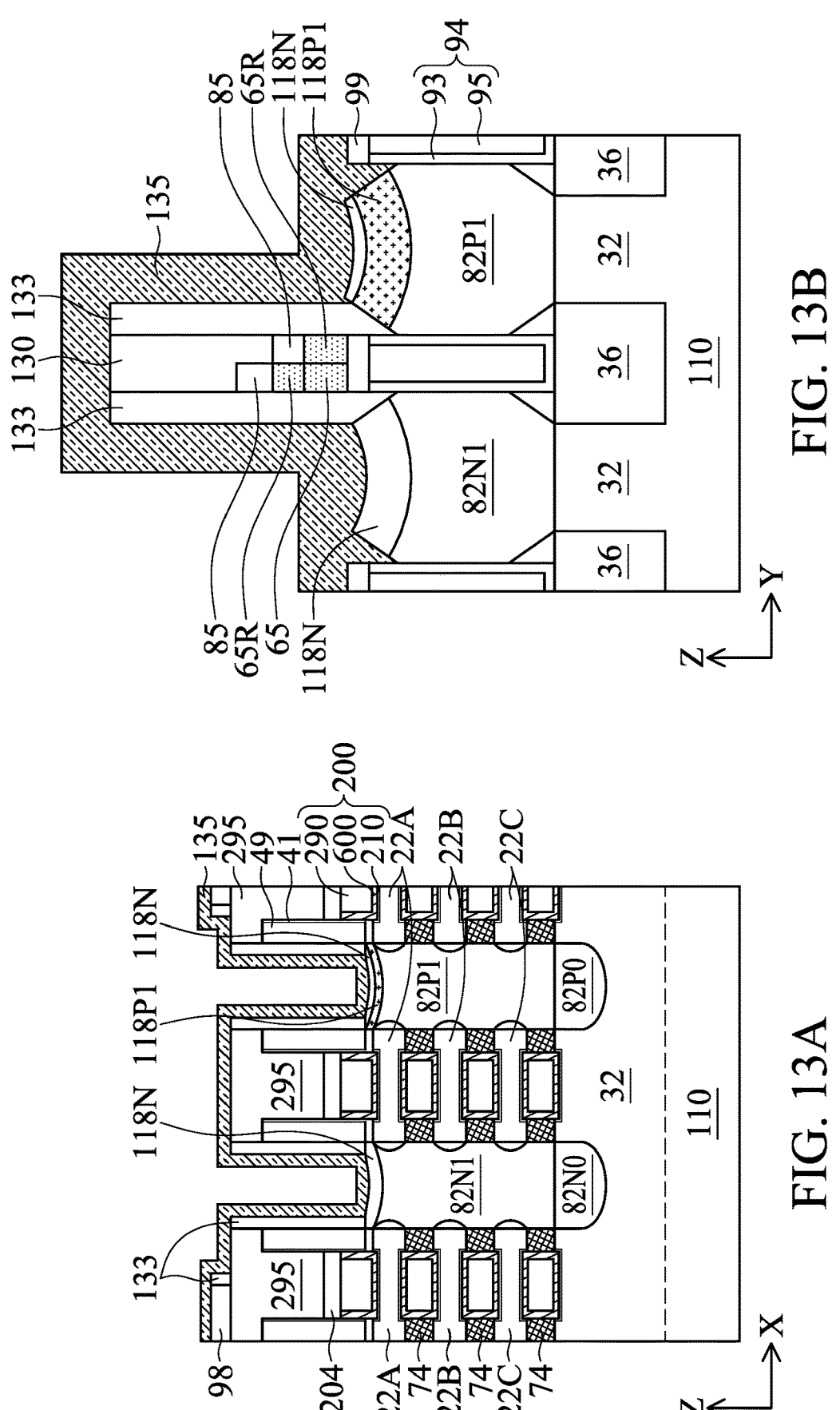

In FIGS. 13A, 13B, following removal of the P-type metal layer 115 and the spacer layers 65, 65R, 85, a third spacer layer 133 is formed on sidewalls of the capping layers 295, the spacer layers 41, the ILD 130 and remaining portions of the spacer layers 65, 65R, 85, corresponding to act 2300 of FIG. 17. The third spacer layer 133 lands on, and physically contacts, the first silicide layer 118P1 and the N-type source/drain region 82N. Formation of the third spacer layer 133 may be similar in many respects to the formation of the third spacer layer 85 described with reference to FIGS. 8A-8D. In some embodiments, the third spacer layer 133 is deposited as a conformal thin layer of a material that may be or include SiN, SiCN, SiOCN, SiO, a high-k dielectric material, or other suitable material. The third spacer layer 133 may be deposited to a thickness in a range of about 2 nm to about 6 nm. In some embodiments, the third spacer layer 133 is or comprises a different material than that of the second spacer layers 65, 65R. For example, the third spacer layer 133 may be a thin layer of SiCN, and one or more of the second spacer layers 65, 65R may be a thin layer of SiN. Horizontal portions of the third spacer layer 133 overlying the source/drain regions 82 are removed to expose the source/drain regions 82. The third spacer layer 133 aids in preventing shorts between the gate structure 200 and the source/drain contacts 120.

Following formation of the third spacer layer 133, an N-type metal layer 135 is formed overlying the source/drain regions 82, the third spacer layer 133, the capping layer 295 and the ILD 130. In some embodiments, the N-type metal layer 135 is formed as a conformal thin layer and does not fill completely the openings over the source/drain regions 82. The N-type metal layer 135 may be or include Ti, Cr, Ta, Mo, Zr, Hf, Sc, Ys, Ho, Tb, Gd, Lu, Dy, Er, Yb or another suitable material. Following formation of the N-type metal layer 135, a second silicide layer 118N is formed on the source/drain regions 82 by an annealing operation, corresponding to act 2400 of FIG. 17. In some embodiments, the second silicide layer 118N is or includes TiSi, CrSi, TaSi, MoSi, ZrSi, HfSi, ScSi, YSi, HoSi, TbSi, GdSi, LuSi, DySi, ErSi, YbSi or the like. The second silicide layer 118N may diffuse into regions below the third spacer layer 133. In some embodiments, the lower surface of the third spacer layer 133 is entirely in contact with the second silicide layer 118N, for example, when the second silicide layer 118N diffuses in the X-axis direction to contact the inner spacers 74. In some embodiments, the lower surface of the third spacer layer 133 is in partial contact with the second silicide layer 118N and with the second N-type epitaxial region 82N1, for example, when the second silicide layer 118N diffuses under the third spacer layer 133 but does not extend to the inner spacers 74. In some embodiments, the lower surface of the third spacer layer 133 is not in contact with the second silicide layer 118N, for example, when the second silicide layer 118N does not diffuse under the third spacer layer 133. The second silicide layer 118N may have thickness in a range of about 1 nm to about 10 nm. Below about 1 nm, thickness of the second silicide layer 118N may not reduce contact resistance sufficiently. Above about 10 nm, the second silicide layer 118N may short with the channels 22A.

Figures 14A, 14B:
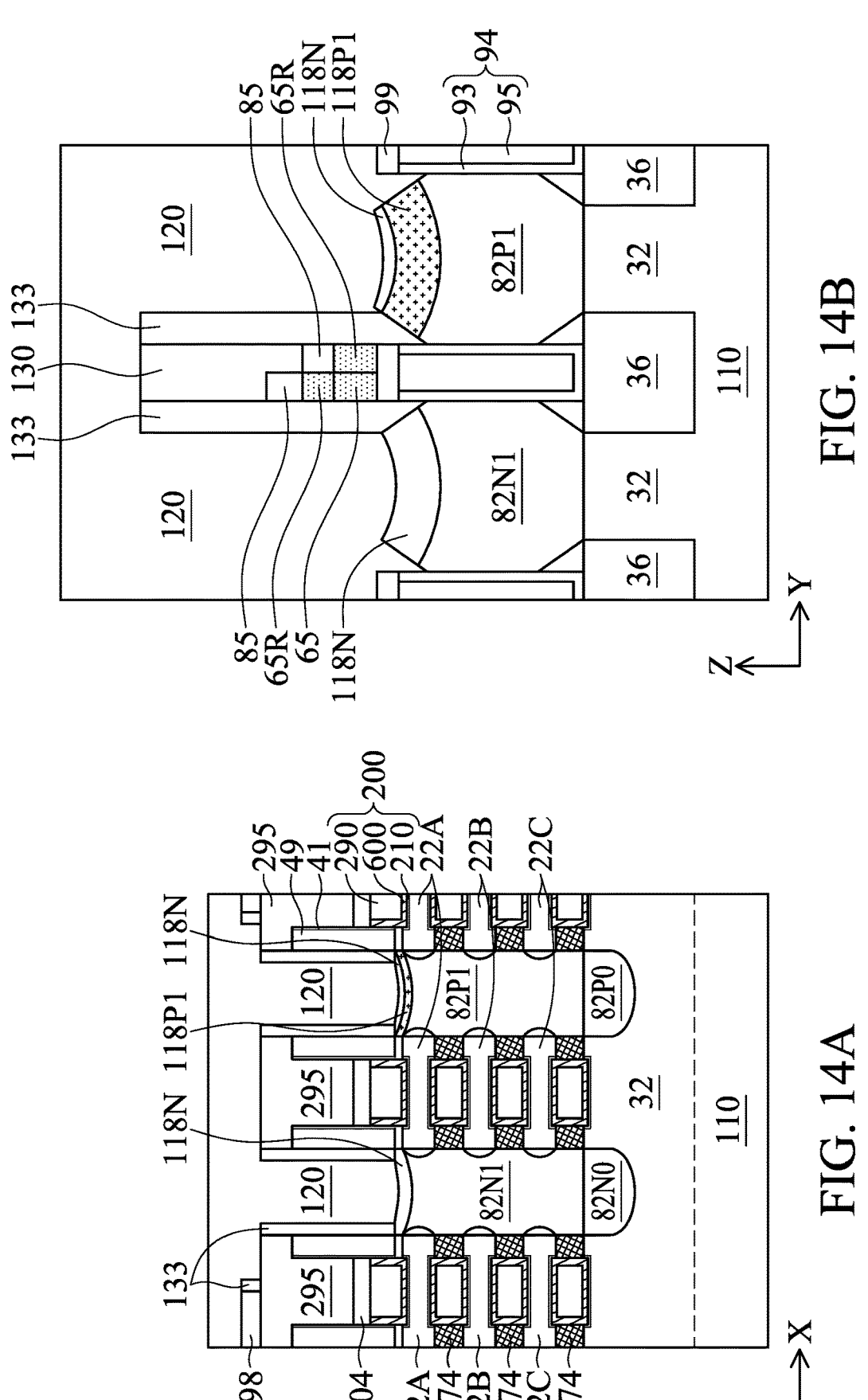
Figure 14C:
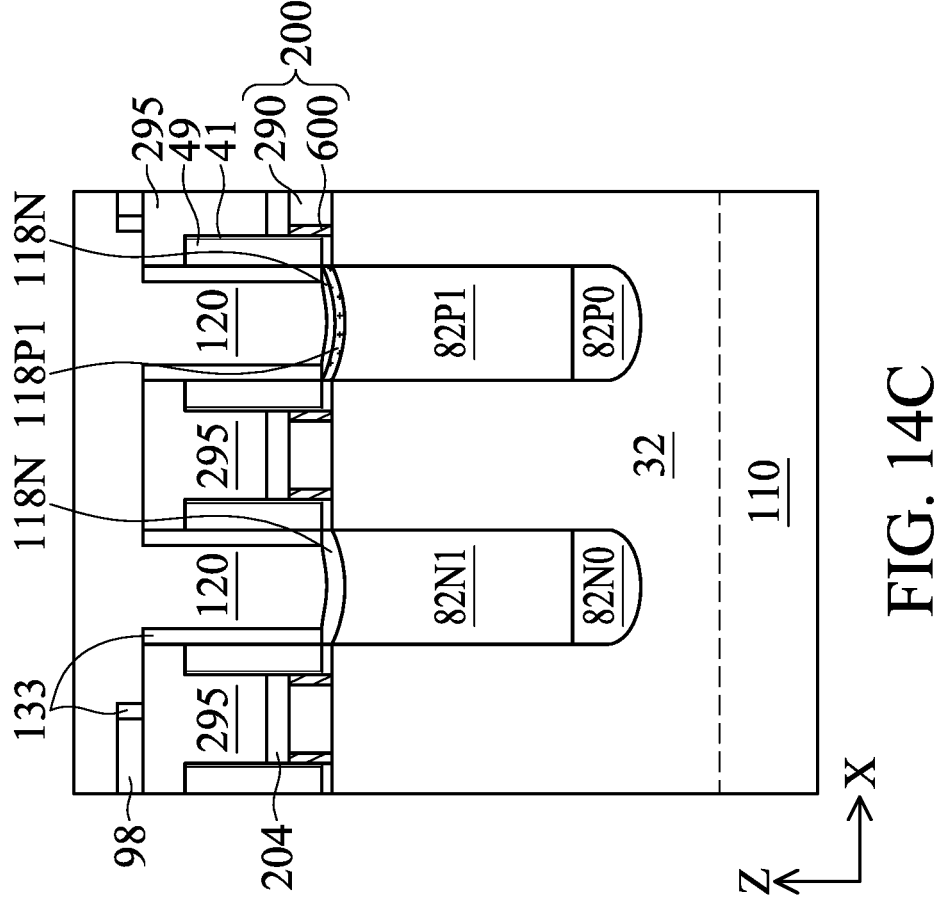

In FIGS. 14A-14C, following formation of the third spacer layer 133 and the second silicide layer 118N, unreacted portions of the N-type metal layer 135 are removed, and the source/drain contacts 120 are formed, corresponding to act 2500 of FIG. 17. In some embodiments, the unreacted N-type metal layer 135 is removed by one or more etching operations selective to the material of the N-type metal layer 135 that do not significantly attack the underlying structure. Following removal of the N-type metal layer 135, the source/drain contacts 120 are formed by filling the openings over the source/drain regions 82 with, for example, a plug metal. In some embodiments, the source/drain contacts 120 are formed by depositing a material that is or includes a conductive material such as Co, W, Ru, combinations thereof, or the like. In some embodiments, the source/drain contacts 120 are or include a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. The source/drain contacts 120 land on the second silicide layer 118N and are in contact with the third spacer layer 133 and the hybrid fins 94. Description of the device 20 and illustration thereof in many of the figures is given with reference to GAAFETs including vertical stacks of the nanostructures 22. In some embodiments, the first and second silicide layers 118P1, 118N are formed in source/drain regions 82 of FinFET devices, which is illustrated in FIG. 14C.

Additional processing may be performed to finish fabrication of the nanostructure devices 20. For example, gate contacts may be formed to electrically couple to the gate structures 200. An interconnect structure may then be formed over the source/drain contacts 120 and the gate contacts. The interconnect structure may include a plurality of dielectric layers surrounding metallic features, including conductive traces and conductive vias, which form electrical connection between devices on the substrate 110, such as the nanostructure devices 20, as well as to IC devices external to the IC device 20. In some embodiments, second capping layers (not shown) are present over the source/drain contacts 120. Configurations in which only the capping layers 295 over the gate structures 200 are present (e.g., no second capping layers present over the source/drain contacts 120) may be considered "single SAC" structures, and configurations in which the capping layers 295 and the second capping layers are both present may be considered "double SAC" structures.

Embodiments may provide advantages. By using FEOL dielectric hardmask (HM) on N epitaxial regions and keeping the HM through P+ implantation and P work function silicide processes, a self-aligned dual silicide process combined with high P epitaxial region activation may be achieved without additional P+ photomask cost. Specifically, by using front-end-of-line (FEOL) spacer layers (e.g., the spacer layers 65, 65R, 85) on the N-type epitaxial structures 82N during P+ implant and P-type work function silicide processes, P+ implantation into NMOS regions may be prevented. As such, the self-aligned dual silicide process combined with high P-type epitaxial activation is achieved without additional photolithography cost. Use of dual silicide combined with self-aligned P+ implantation for better contact resistance improves speed performance and lowers cost.

In accordance with at least one embodiment, a device includes a substrate, a gate structure, a source/drain region, a first silicide layer, a second silicide layer and a contact. The gate structure wraps around at least one vertical stack of nanostructure channels. The source/drain region abuts the gate structure. The first silicide layer includes a first metal component on the source/drain region. The second silicide layer includes a second metal component different than the first metal component, and is on the first silicide layer. The contact is on the second silicide layer.

In accordance with at least one embodiment, a device includes a substrate and a vertical stack of nanostructures over the substrate. An N-type source/drain region abuts first ends of the nanostructures. A P-type source/drain region abuts second ends of the nanostructures. A P-type silicide layer is on the P-type source/drain region. An N-type silicide layer is on the N-type source/drain region and the P-type source/drain region. Contacts are on the N-type silicide layer.

In accordance with at least one embodiment, a method includes: forming a first source/drain region and a second source/drain region on and in a substrate, the first source/drain region laterally separated from the second source/drain region; forming a first silicide layer on the second source/drain region while the first source/drain region is masked; forming a second silicide layer on the first and second source/drain regions; and forming contacts on the second silicide layer over the first and second source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a gate structure wrapping around at least one vertical stack of nanostructure channels;
   a source/drain region abutting the at least one vertical stack of nanostructure channels;
   a first silicide layer including a first metal component directly physically contacting the source/drain region;
   a second silicide layer including a second metal component different than the first metal component, the second silicide layer directly physically contacting the first silicide layer;
   a contact directly physically contacting the second silicide layer;
   a second source/drain region abutting the gate structure;
   a third silicide layer directly physically contacting the second source/drain region, the third silicide layer has the same material as the second silicide layer; and
   a second contact contacting the third silicide layer.

2. The device of claim 1, wherein the first silicide layer includes NiSi, CoSi, MnSi, WSi, FeSi, RhSi, PdSi, RuSi, PtSi, IrSi, or OsSi.

3. The device of claim 1, wherein the second silicide layer includes TiSi, CrSi, TaSi, MoSi, ZrSi, HfSi, ScSi, Ysi, TbSi, GdSi, LuSi, DySi, ErSi, or YbSi.

4. The device of claim 1, wherein the first silicide layer is thicker than the second silicide layer.

5. The device of claim 1, wherein the source/drain region includes a doped region including implants in contact with the first silicide layer.

6. The device of claim 5, wherein the implants include Ga, B, C or Sn, at a depth in a range of about 3 nanometers to about 10 nanometers, at a concentration in a range of about $10^{18}$ cm$^{-3}$ to about $10^{21}$ cm$^{-3}$.

7. The device of claim 1, including a hybrid fin abutting the source/drain region.

8. The device of claim 1, comprising:

a first spacer layer along sidewalls of the contact, the first spacer layer landing on the second silicide layer; and a second spacer layer between the first spacer layer and the gate structure.

9. A device comprising:

a substrate;

a vertical stack of nanostructures over the substrate;

an N-type source/drain region abutting first ends of the nanostructures;

a P-type source/drain region abutting second ends of the nanostructures;

a P-type silicide layer directly physically contacting the P-type source/drain region;

an N-type silicide layer directly physically contacting the N-type source/drain region and directly physically contacting the P-type silicide layer on the P-type source/ drain region; and contacts directly physically contacting the N-type silicide layer.

10. The device of claim 9, wherein ratio of thickness of the P-type silicide layer to thickness of the N-type silicide layer over the P-type source/drain region is in a range of about 3:1 to about 5:1.

11. The device of claim 9, wherein thickness of the N-type silicide layer on the N-type source/drain region is substan-tially the same as combined thickness of the N-type silicide layer and the P-type silicide layer on the P-type source/drain region.

12. The device of claim 9, comprising a spacer layer on sidewalls of the contacts, wherein the N-type silicide layer and the P-type silicide layer extend underneath the spacer layer.

13. The device of claim 9, wherein:

the N-type source/drain region includes SiP, SiAs, SiSb, SiPAs or SiP:As:Sb; and the P-type source/drain region includes SiGe:B, SiGe:B: Ga, SiGe:Sn or SiGe:B:Sn.

14. A device, comprising:

a substrate;

a source/drain region abutting at least one vertical stack of nanostructure channels;

a first silicide layer including a first metal component directly physically contacting the source/drain region;

a second silicide layer including a second metal compo-nent different than the first metal component, the sec-ond silicide layer directly physically contacting the first silicide layer;

a second source/drain region abutting the at least one vertical stack of nanostructure channels; and a third silicide layer directly physically contacting the second source/drain region, the third silicide layer has the same material as the second silicide layer.

15. The device of claim 14, wherein the first silicide layer includes NiSi, CoSi, MnSi, WSi, FeSi, RhSi, PdSi, RuSi, PtSi, IrSi, or OsSi.

16. The device of claim 14, wherein the second silicide layer includes TiSi, CrSi, TaSi, MoSi, ZrSi, HfSi, ScSi, Ysi, HoSi, TbSi, GdSi, LuSi, DySi, ErSi, or YbSi.

17. The device of claim 14, wherein the first silicide layer is thicker than the second silicide layer.

18. The device of claim 14, wherein the source/drain region includes a doped region including implants in contact with the first silicide layer.

19. The device of claim 14, wherein ratio of thickness of the first silicide layer to thickness of the second silicide layer over the source/drain region is in a range of about 3:1 to about 5:1.

20. The device of claim 1, wherein the first silicide layer is aligned with the gate structure in a horizontal direction.

* * * * *